US010917962B2

(12) United States Patent
Motohashi et al.

(10) Patent No.: US 10,917,962 B2
(45) Date of Patent: Feb. 9, 2021

(54) ELECTRONIC DEVICE

(71) Applicant: RENESAS ELECTRONICS CORPORATION, Tokyo (JP)

(72) Inventors: Norikazu Motohashi, Tokyo (JP); Shinji Nishizono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 415 days.

(21) Appl. No.: 16/030,171

(22) Filed: Jul. 9, 2018

(65) Prior Publication Data

US 2019/0053368 A1 Feb. 14, 2019

(30) Foreign Application Priority Data

Aug. 8, 2017 (JP) ................. 2017-152938

(51) Int. Cl.
*H05K 1/02* (2006.01)
*H05K 5/00* (2006.01)
(Continued)

(52) U.S. Cl.
CPC ........... *H05K 1/0207* (2013.01); *H02K 11/33* (2016.01); *H02K 11/40* (2016.01); *H05K 5/006* (2013.01); *H05K 5/04* (2013.01); *H05K 7/1432* (2013.01); *H05K 7/209* (2013.01); *H02K 2211/03* (2013.01); *H05K 2201/093* (2013.01); *H05K 2201/09027* (2013.01); *H05K 2201/09063* (2013.01); *H05K 2201/10166* (2013.01); *H05K 2201/10409* (2013.01)

(58) Field of Classification Search
CPC ........ H05K 1/0207; H05K 5/006; H05K 5/04; H05K 7/1432; H05K 7/209; H05K 2201/09027; H05K 2201/09063; H05K 2201/093; H02K 11/33; H02K 11/40
See application file for complete search history.

(56) References Cited

U.S. PATENT DOCUMENTS 8,085,548 B2 12/2011 Funato et al.
2005/0145414 A1* 7/2005 Tohkairin ............. H05K 1/0207
174/252
(Continued)

FOREIGN PATENT DOCUMENTS

JP 2001-313488 A 11/2001
JP 2008-060435 A 3/2008

*Primary Examiner* — Jue Zhang
(74) *Attorney, Agent, or Firm* — McDermott Will & Emery LLP

(57) ABSTRACT

The reliability of an electronic device is improved. An electronic device has a wiring substrate and a housing made of a metal for supporting the wiring substrate. A semiconductor device having a switching power transistor is mounted at the wiring substrate. A ground pattern of a conductive film and a heat radiation pattern of a conductive film are formed at the wiring substrate. The heat radiation pattern is not electrically coupled with any electronic component mounted at the wiring substrate, and is also not electrically coupled with the ground pattern. The ground pattern overlaps the semiconductor device in the thickness direction of the wiring substrate. The heat radiation pattern overlaps the ground pattern in the thickness direction of the wiring substrate, and overlaps a region where the housing and the wiring substrate are in contact with each other.

18 Claims, 25 Drawing Sheets

(51) Int. Cl.
*H05K 5/04* (2006.01)
*H05K 7/20* (2006.01)
*H02K 11/33* (2016.01)
*H02K 11/40* (2016.01)
*H05K 7/14* (2006.01)

(56) References Cited

U.S. PATENT DOCUMENTS

| | | | | |
|---|---|---|---|---|
| 2010/0033972 A1* | 2/2010 | Maglica | ............... | H05K 1/0207 362/294 |
| 2015/0055302 A1* | 2/2015 | Nagatomo | ........... | H05K 1/0207 361/709 |
| 2016/0021730 A1* | 1/2016 | Decker | ................ | H05K 1/0207 361/720 |
| 2018/0014426 A1* | 1/2018 | Kim | ..................... | H05K 1/0204 |
| 2019/0364656 A1* | 11/2019 | Robin | ................. | H05K 1/0207 |

* cited by examiner

ELECTRONIC DEVICE

CROSS-REFERENCE TO RELATED APPLICATIONS

The disclosure of Japanese Patent Application No. 2017-152938 filed on Aug. 8, 2017 including the specification, drawings and abstract is incorporated herein by reference in its entirety.

BACKGROUND

The present invention relates to an electronic device, and is preferably applicable to, for example, an electronic device for driving a motor.

Japanese Unexamined Patent Application Publication No. 2001-313488 (Patent Document 1) describes a structure in which a substrate is electrically and mechanically coupled with a housing by a screw.

Further, Japanese Unexamined Patent Application Publication No. 2008-60435 (Patent Document 2) describes a structure in which a conductor pattern at the peripheral edge of the opening for coupling a substrate to a housing and a conductor pattern electrically coupled with a power supply are coupled by a capacitor.

CITED DOCUMENTS

Patent Documents

[Patent Document 1] Japanese Unexamined Patent Application Publication No. 2001-313488
[Patent Document 2] Japanese Unexamined Patent Application Publication No. 2008-60435

SUMMARY

For example, for an electronic device in which a semiconductor device for supplying an output for driving a motor is mounted over a wiring substrate, desirably, the structure of the wiring substrate is devised, thereby to improve the reliability of the electronic device.

Other objects and novel features will be apparent from the description of this specification and the accompanying drawings.

An electronic device in accordance with one embodiment includes: a wiring substrate having a first main surface, a second main surface opposite to the first main surface, and a plurality of wiring layers arranged between the first main surface and the second main surface; one or more components including a first semiconductor device, mounted over the wiring substrate; and a housing made of a metal for supporting the wiring substrate. The first semiconductor device has a switching power transistor. The housing is in contact with the second main surface of the wiring substrate. A first conductor pattern is formed at a first wiring layer of the wiring layers, and a second conductor pattern is formed at a second wiring layer of the wiring layers. The first conductor pattern is a ground pattern for supplying a ground potential or a power supply pattern for supplying a power supply potential, and overlaps the first semiconductor device in the thickness direction of the wiring substrate. The second conductor pattern is not electrically coupled with any of the one or more components, and is also not electrically coupled with the first conductor pattern. The second conductor pattern overlaps the first conductor pattern in the thickness direction of the wiring substrate, and overlaps a region where the housing and the wiring substrate are in contact with each other in the thickness direction of the wiring substrate.

In accordance with one embodiment, it is possible to improve the reliability of an electronic device.

DETAILED DESCRIPTION

In the following embodiments, a description on the same or similar part will not be repeated in principle unless otherwise required.

Further, in description of the following embodiment, the embodiment may be described in a plurality of divided sections or embodiments for convenience, if required. However, unless otherwise specified, these are not independent of each other, but are in a relation such that one is a modification example, a detailed description, complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, or except for other cases.

Further, in the following embodiments, it is naturally understood that the constitutional elements (including element steps, or the like) are not always essential, unless otherwise specified, except for the case where they are apparently considered essential in principle, or except for other cases.

Further, in the following embodiments, it is naturally understood that the wording "comprising A", "formed of A", "having A", or "including A" for the constituent elements or the like does not exclude other elements except for the case where A is expressed as only A, or other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, or except for other cases. This also applies to the foregoing numerical values and ranges.

Below, embodiments will be described in details by reference to the accompanying drawings. Incidentally, in all the drawings for describing the embodiments, the members having the same function are given the same reference sign and numeral, and a repeated description thereon is omitted. Further, hatching may be added even in a plan view for ease of understanding of the drawings.

First Embodiment

Structure of Electronic Device

Figure 1:
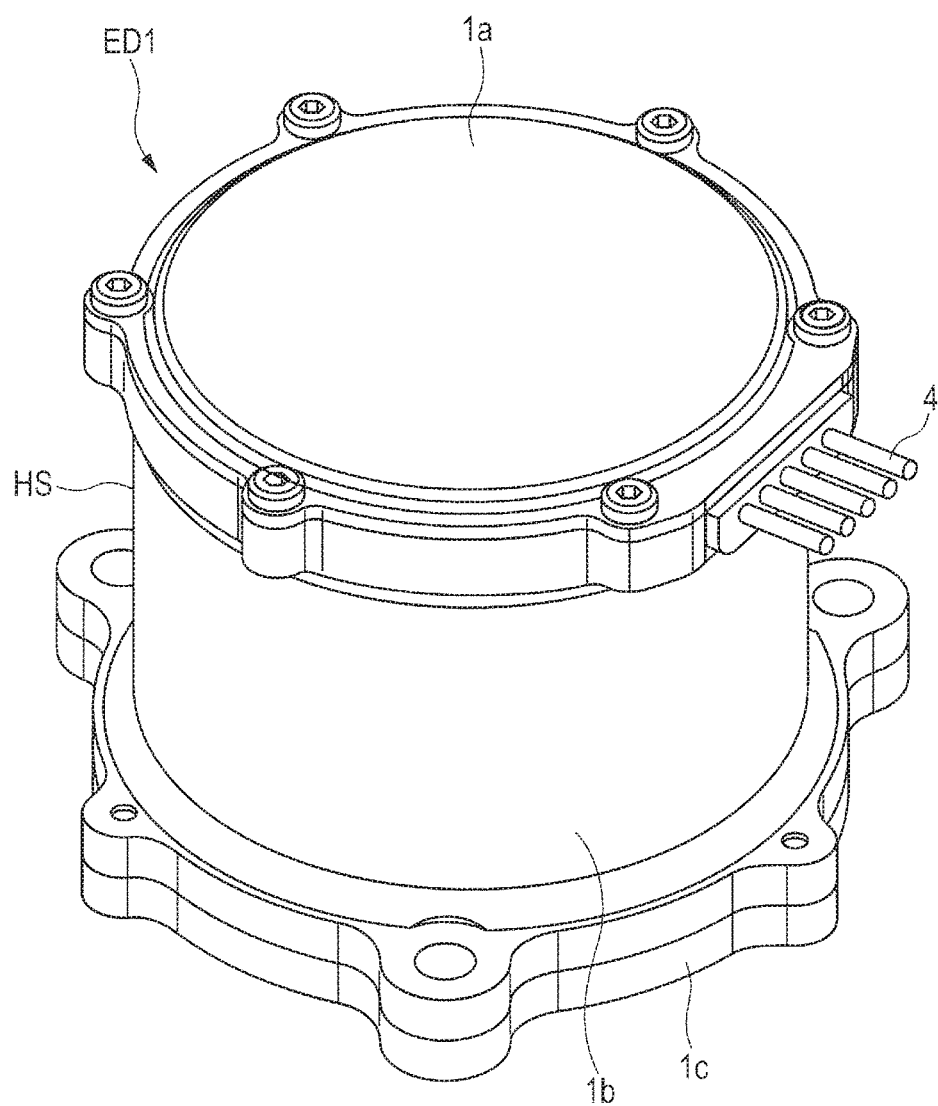
FIG. 1 is an outward perspective view showing a structure of an electronic device of First Embodiment.
Figure 2:
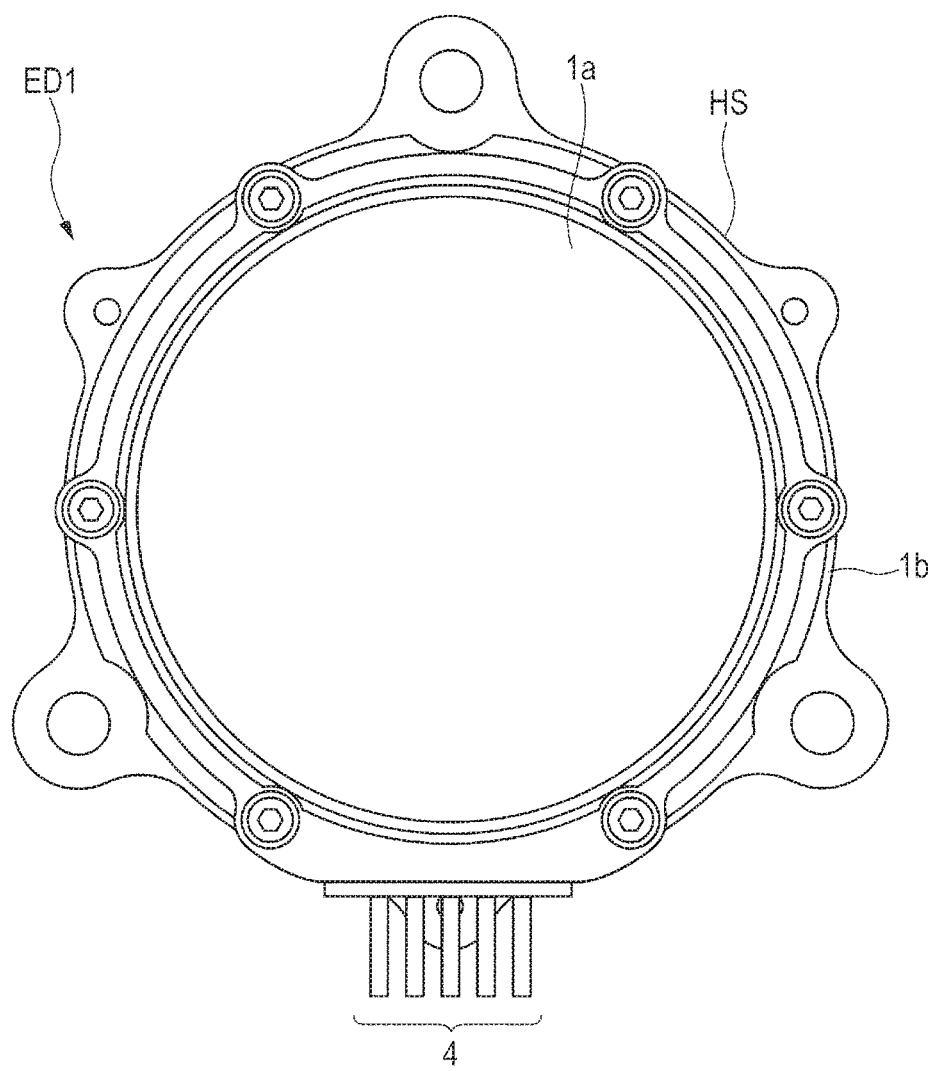
FIG. 2 is a plan view showing a structure of the electronic device shown in FIG. 1.
Figure 3:
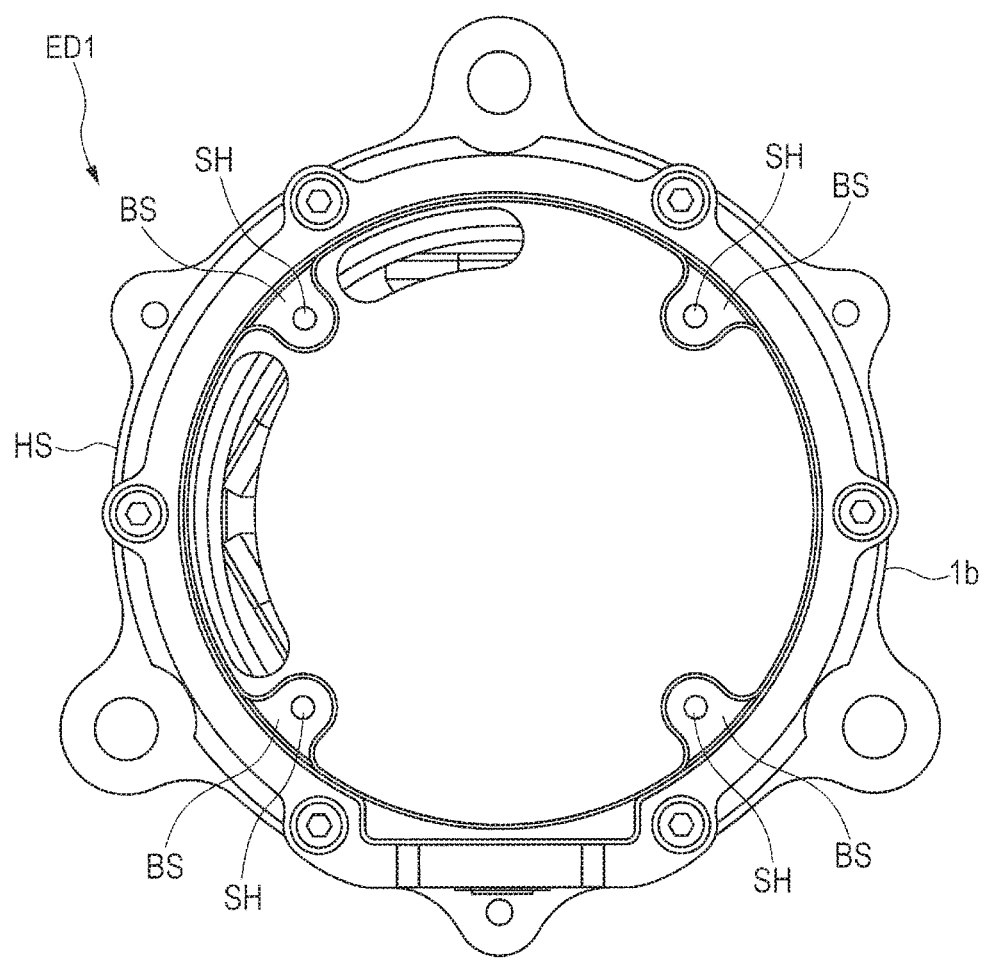
FIG. 3 is a plan view showing an internal structure of the electronic device shown in FIG. 1 with a wiring substrate removed.
Figure 4:
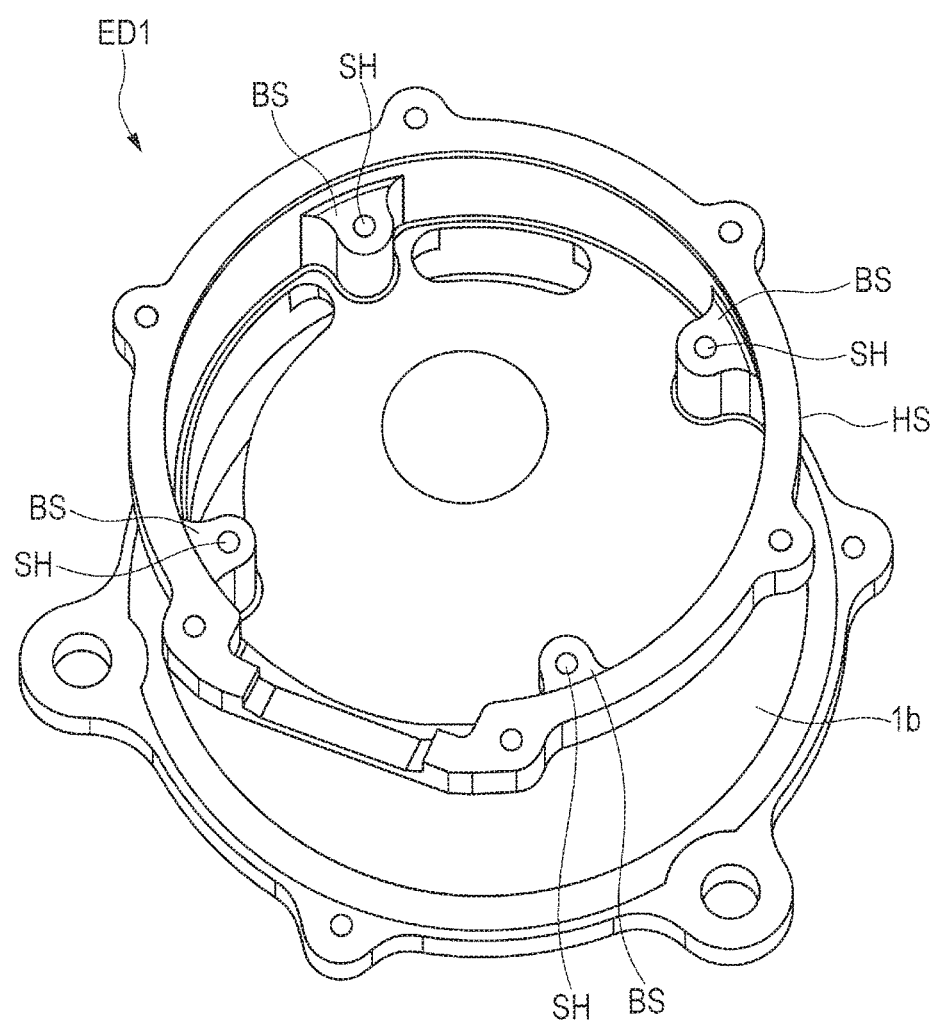
FIG. 4 is a perspective view showing an internal structure of the electronic device shown in FIG. 1 with a wiring substrate removed.
Figure 5:
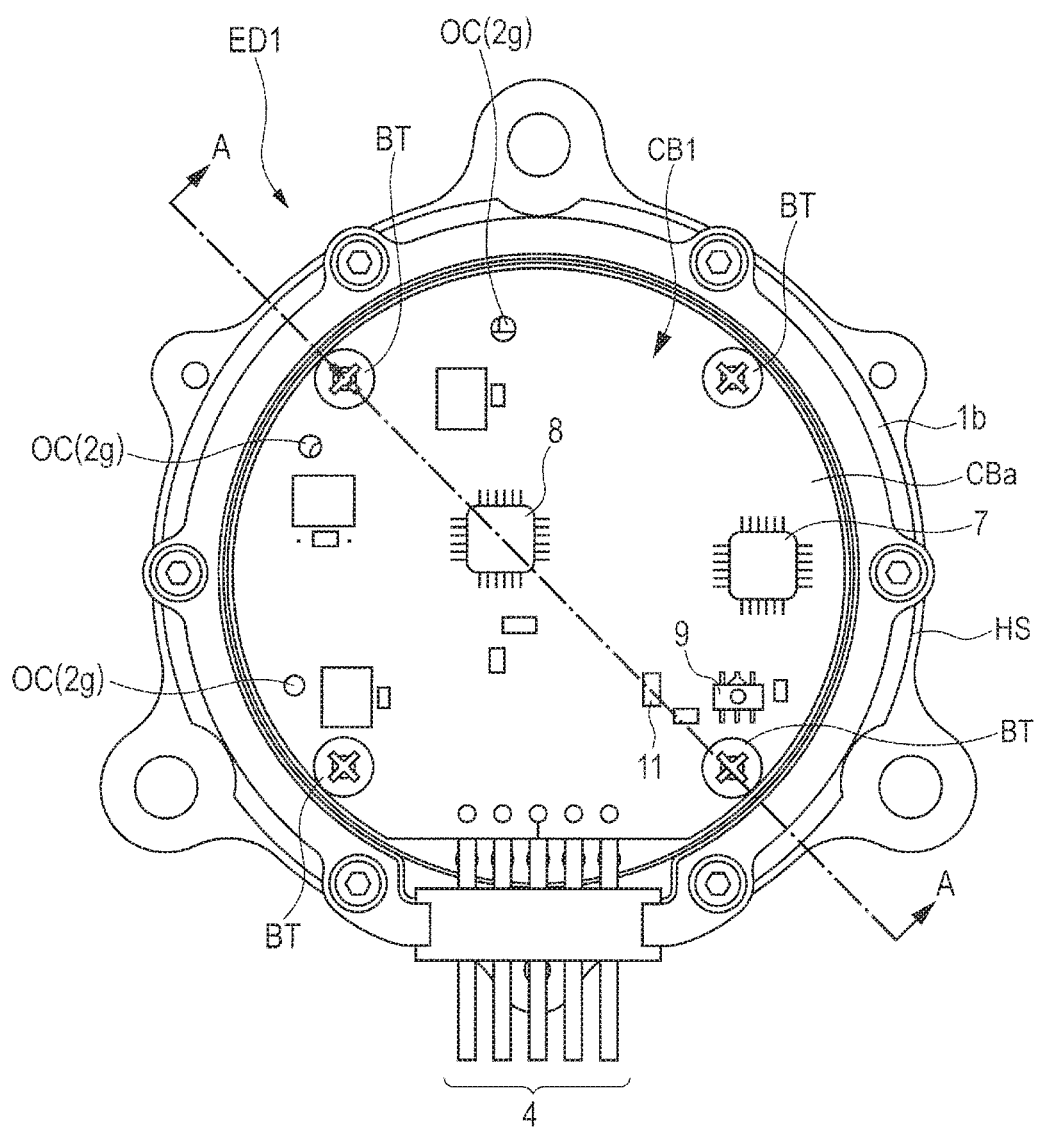
FIG. 5 is a plan view showing an internal structure of the electronic device shown in FIG. 1.
Figure 6:
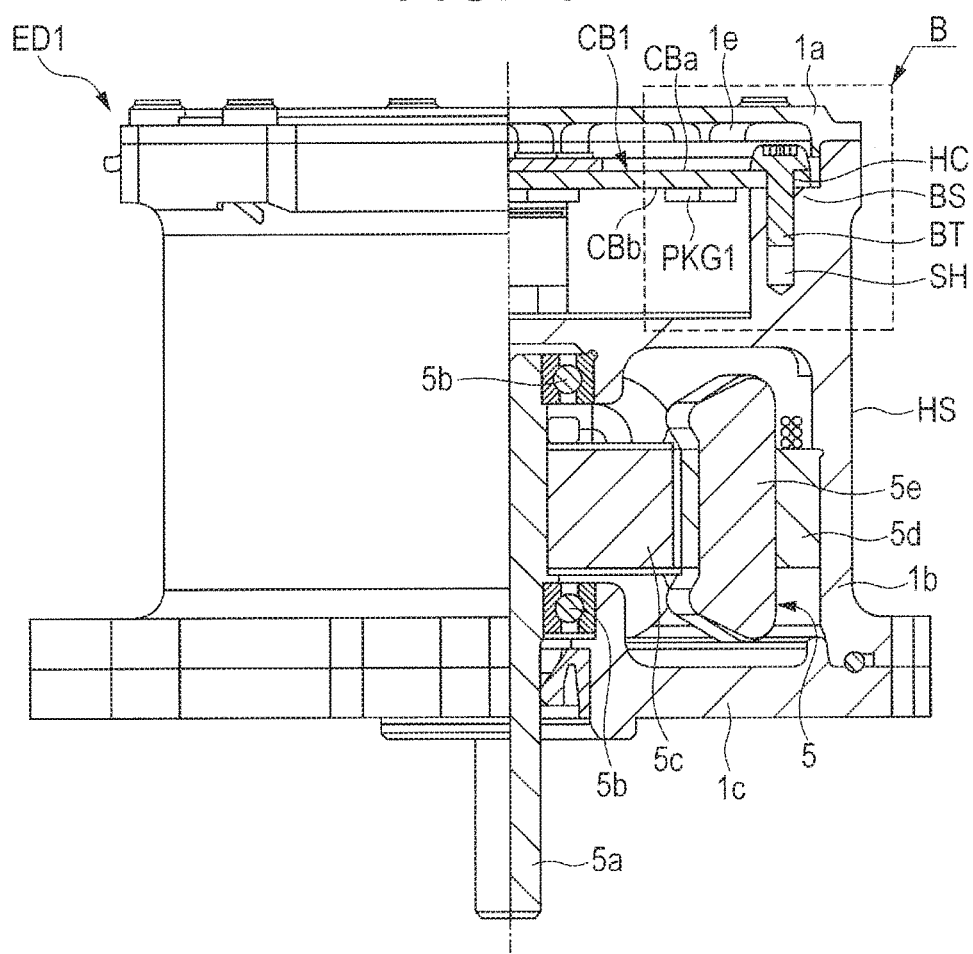
FIG. 6 is a partial cross sectional view showing a structure partially broken along line A-A of FIG. 5.
Figure 7:
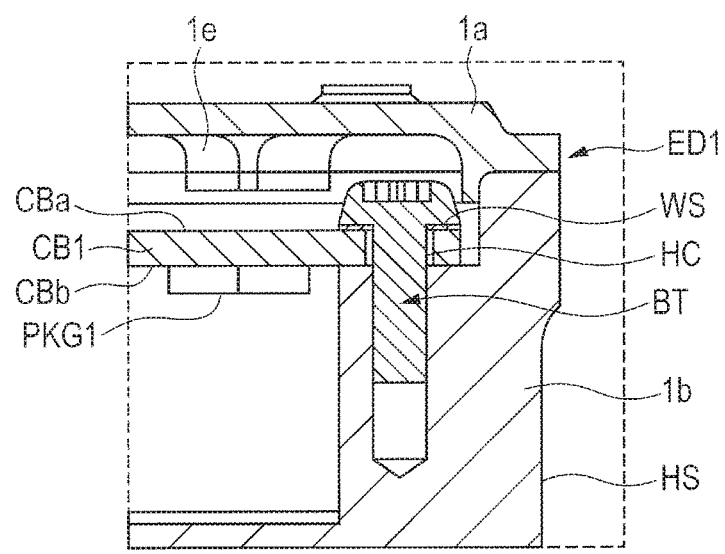
FIG. 7 is a partially enlarged cross sectional view showing a structure of a part B of FIG. 6 on an enlarged scale.

FIG. 1 is an outward perspective view showing a structure of an electronic device of First Embodiment; FIG. 2 is a plan view showing a structure of the electronic device shown in FIG. 1; FIG. 3 is a plan view showing an internal structure of the electronic device shown in FIG. 1 with a wiring substrate removed; FIG. 4 is a perspective view showing an internal structure of the electronic device shown in FIG. 1 with a wiring substrate removed; FIG. 5 is a plan view showing an internal structure of the electronic device shown in FIG. 1; FIG. 6 is a partial cross sectional view showing a structure partially broken along line A-A of FIG. 5; and FIG. 7 is a partially enlarged cross sectional view showing a structure of a part B of FIG. 6 on an enlarged scale.

A description will be given to a structure of an electronic device of the present First Embodiment. An electronic device ED1 shown in FIGS. 1 to 5 is formed in a substantially overall cylindrical shape. The electronic device ED1 has a wiring substrate CB1 such as an inverter board in which electronic components are mounted at a wiring substrate (substrate), and a housing HS made of a metal for supporting the wiring substrate CB1. Then, as shown in FIG. 6, a motor 5 is incorporated in a housing HS of the electronic device ED1. The wiring substrate CB1 is a substrate for supplying an electric power to the motor 5, and controlling the motor 5. When the electronic device ED1 is to be mounted in a vehicle, the motor 5 is, for example, coupled with a pump mechanism of an internal gear type, thereby to be a vehicle idling stopping electric oil pump.

Figure 9:
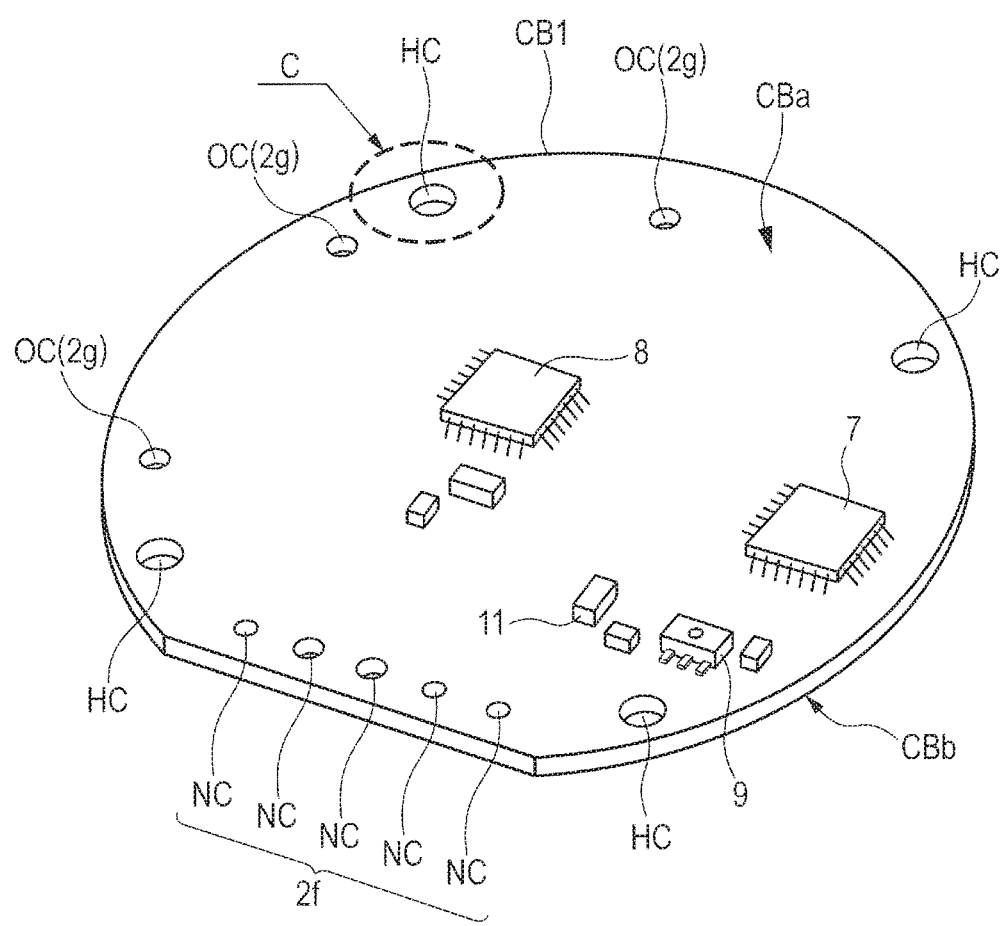
FIG. 9 is a perspective view showing the surface side of the wiring substrate to be mounted in the electronic device of FIG. 1.
Figure 11:
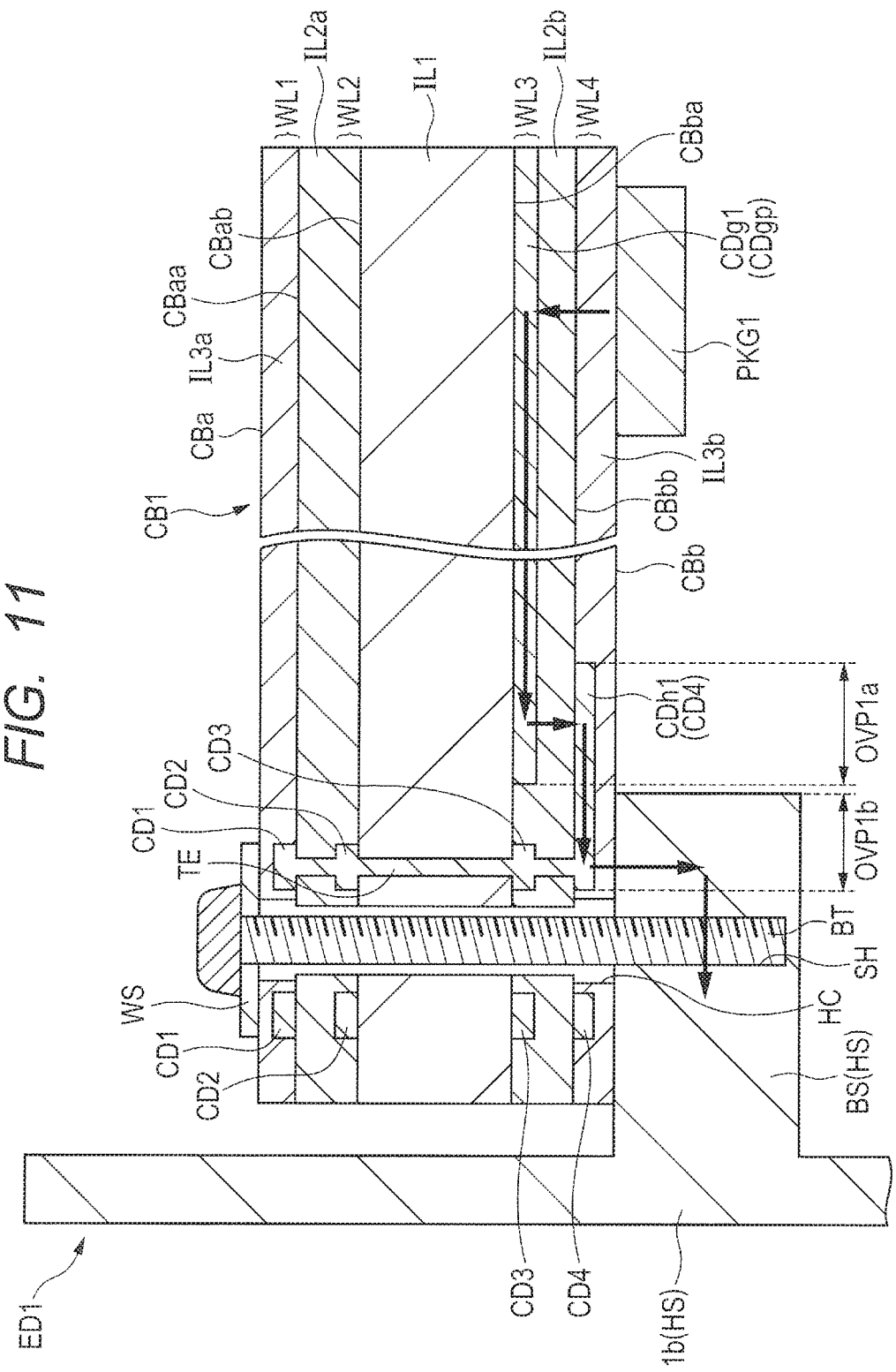
FIG. 11 is a partially enlarged cross sectional view showing a fixed structure of the wiring substrate at the part C in FIG. 9.

As shown in FIGS. 1 to 4, the housing HS is formed of a cylindrical main body part 1b, a cover 1a arranged on the upper side of the main body part 1b, and a bracket 1c arranged on the lower side. The main body part 1b, the cover 1a, and the bracket 1c are each made of a metal, and is formed of, for example, an aluminum alloy. As shown in FIGS. 3 and 4, the main body part 1b is provided with projections BS at a plurality of, for example, four sites formed in a radially inwardly projecting manner. Each projection BS includes a screw hole SH formed therein. Further, as shown in FIG. 9 described later, at the circumferential part of the wiring substrate CB1, through holes (first through holes) HC are formed at four sites. Accordingly, as shown in FIG. 11 described later, the wiring substrate CB1 is fixed to the projection BS by inserting a screw (bonding member) BT made of a metal into the through hole HC via a washer (sheet conductive member) WS made of a metal, and screwing the screw BT into the screw hole SH of the projection BS. Namely, the wiring substrate CB1 is supported by the main body part 1b via the projection BS. Accordingly, when the cover 1a is removed from the main body part 1b, as shown in FIG. 5, the front surface (first main surface or upper surface) CBa of the wiring substrate CB1 appears. At the front surface CBa and the back surface (second main surface or lower surface) CBb of the wiring substrate CB1 shown in FIG. 6, various ICs (Integrated Circuits) and electronic components are mounted. As shown in FIGS. 6 and 7, a semiconductor device PKG1 forming a power MOSFET (Metal Oxide Semiconductor Field Effect Transistor) of a power transistor is arranged on the back surface CBb side of the wiring substrate CB1. Similarly, semiconductor devices PKG2 and PKG3 (see FIG. 13) forming a power MOSFET of a power transistor are, although not shown, arranged on the back surface CBb side of the wiring substrate CB1.

Further, as shown in FIG. 6, the motor 5 is arranged on the back surface CBb side of the wiring substrate CB1, and is accommodated in the bracket 1c. The motor 5 has a rotor shaft 5a of an output shaft, a rotor core 5c rotating with the rotor shaft 5a, a bearing 5b for supporting the rotor shaft 5a, a stator core 5d of a stator, and fixed to the main body part 1b by press fitting or the like, and a coil 5e of a conductor wire with an insulation film wound around the stator core 5d.

Further, as shown in FIGS. 1, 2, and 5, the electronic device ED1 is electrically coupled with a wire of the wiring substrate CB1 shown in FIG. 5, and is provided with five lead lines 4 of external coupling terminals led out from the wiring substrate CB1.

<Circuit Configuration>

Figure 8:
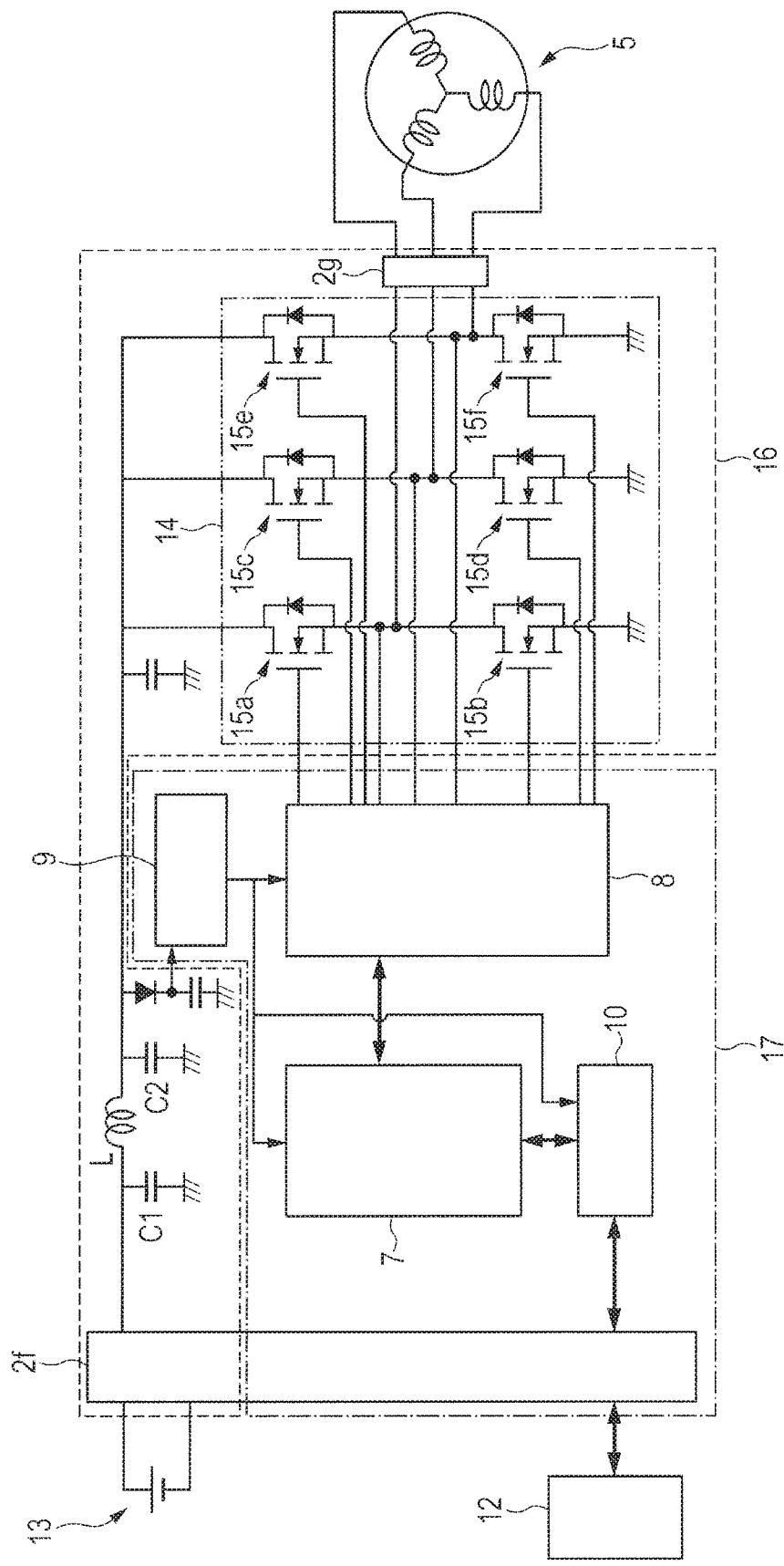
FIG. 8 is a circuit block diagram in a wiring substrate to be mounted in the electronic device of FIG. 1.

Then, a description will be given to the electronic components to be mounted at the wiring substrate CB1 of the electronic device ED1, and the circuit formed of the electronic components. FIG. 8 is a circuit block diagram in the wiring substrate to be mounted in the electronic device ED1 of FIG. 1.

The circuit of the electronic device ED1 of the present First Embodiment is a circuit for driving the motor 5 as shown in FIG. 8, and can be roughly divided into a power type circuit configuration part (power type area) 16 and a control type circuit configuration part (control type area) 17. In FIG. 8, the circuit configuration in a region surrounded by a broken line corresponds to the power type circuit configuration part 16, and the circuit configuration in a region surrounded by a dashed line corresponds to the control type circuit configuration part 17. The power type circuit configuration part 16 and the control type circuit configuration part 17 are formed of the wiring substrate CB1, and the electronic components mounted over the wiring substrate CB1.

The power type circuit configuration part 16 includes an inverter circuit 14 (the region surrounded by a two-dot chain line in FIG. 8). The inverter circuit 14 is formed of a plurality of power MOSFETs 15a, 15b, 15c, 15d, 15e, and 15f of switching elements. The circuit of the present First Embodiment drives the motor 5, and is a three phase inverter circuit 14 including a combination of 6 power MOSFETs 15a, 15b, 15c, 15d, 15e, and 15f. Therefore, the wiring substrate CM is also an inverter board. For this reason, a large current passes through the power type circuit configuration part 16. Incidentally, the semiconductor device PKG1 shown in FIG. 13 described later is a semiconductor device forming the power MOSFET 15a and the power MOSFET 15b. The semiconductor device PKG2 is a semiconductor device forming the power MOSFET 15c and the power MOSFET 15d. The semiconductor device PKG3 is a semiconductor device forming the power MOSFET 15e and the power MOSFET 15f.

On the other hand, in the control type circuit configuration part 17, a MCU (Micro Controller Unit) 7, a predriver 8, a regulator 9, and a communicating IC 10, and other elements (not shown) are mounted.

In the power type circuit configuration part 16, an electric power is supplied from a DC power supply 13 coupled with a coupling through hole (first connector) 2f via a noise filter of a capacitor C1/coil L/capacitor C2 to the inverter circuit 14. Further, in the control type circuit configuration part 17, the power supply voltage is lowered by the regulator 9, to be supplied to the MCU 7, the predriver 8, and the communicating IC 10. In other words, a second voltage lower than the first voltage to be applied to the power type circuit configuration part 16 is applied to the control type circuit configuration part 17. Then, the communication between the MCU 7 and an ECU (Electronic Control Unit) 12 externally provided, and coupled with the coupling through hole 2f is performed via a communicating IC 10.

By the procedure up to this point, the MCU 7 generates a control signal based on a command from the external upper ECU 12. In response to the control signal, the predriver 8 drives the inverter circuit 14. Driving of the inverter circuit 14 controls the rotation of the motor 5 coupled with the coupling through hole (second connector) 2g.

In this manner, the control type circuit configuration part 17 controls the power type circuit configuration part 16. As a result, the DC electric power supplied to the power type circuit configuration part 16 can be converted into an AC electric power to be supplied to the motor 5, thereby to drive the motor 5.

<Structure of Wiring Substrate>

Figure 10:
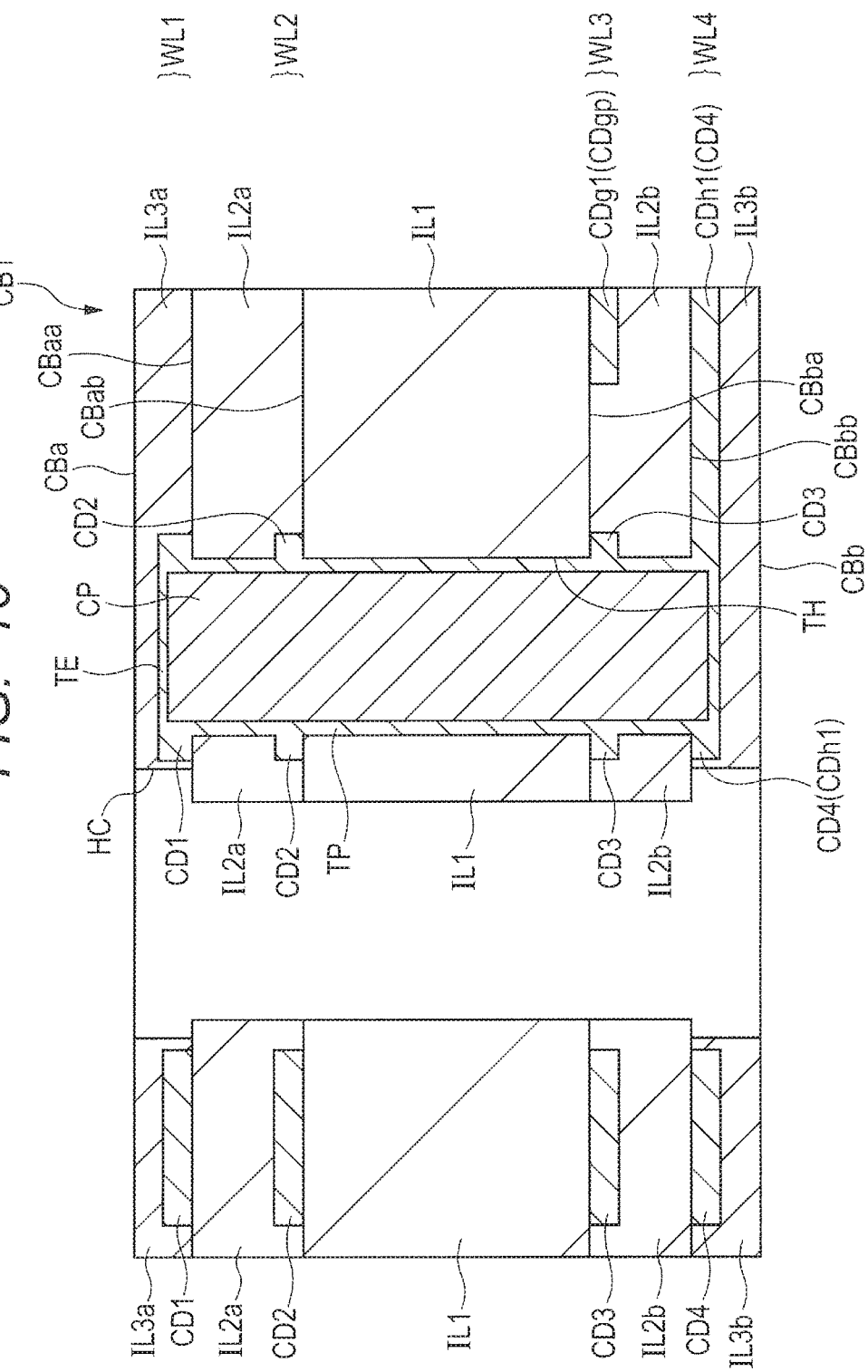
FIG. 10 is a partially enlarged cross sectional view showing a structure of the wiring substrate at a part C in FIG. 9.
Figure 12:
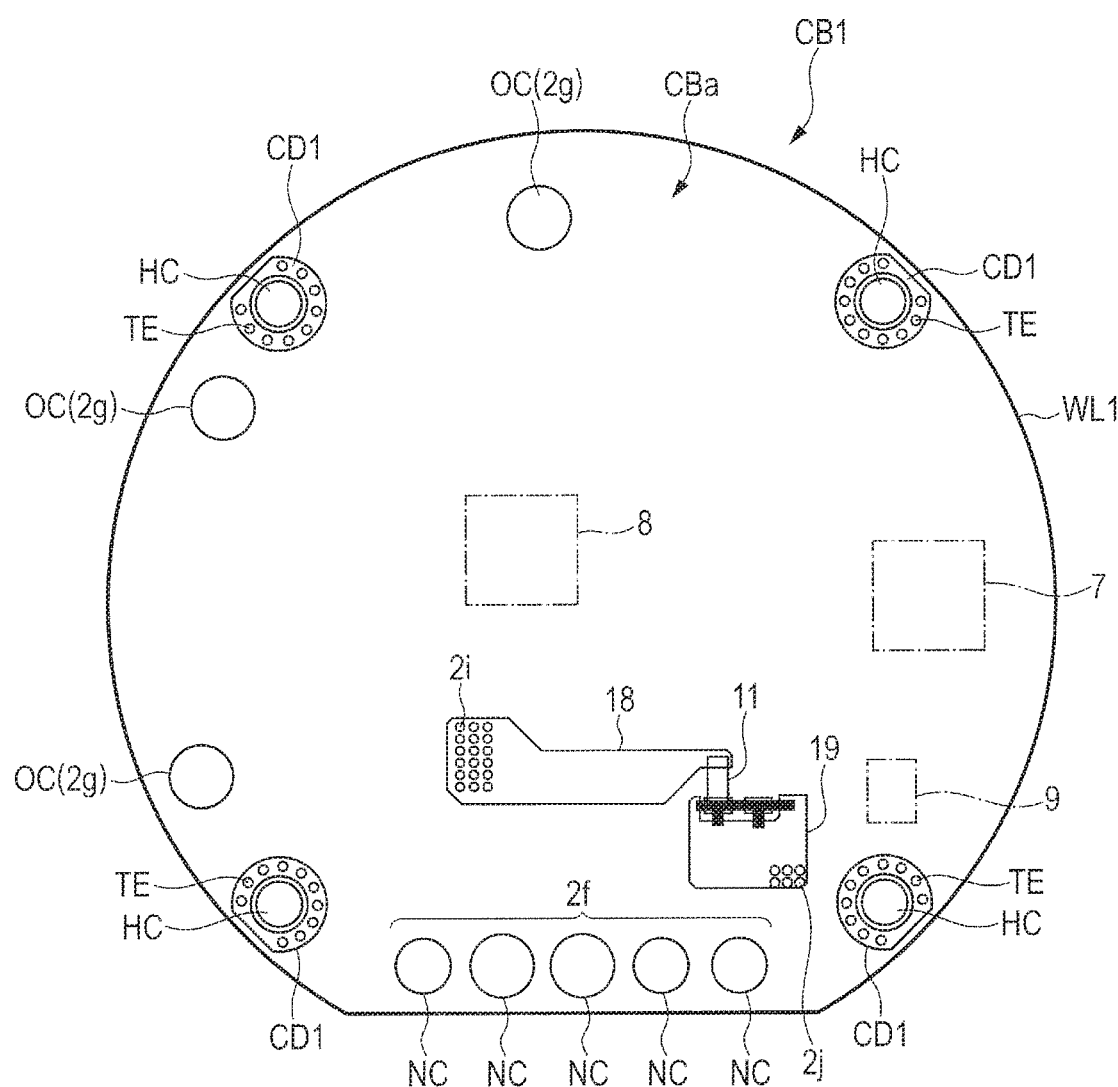
FIG. 12 is a plan view showing a structure of a first wiring layer of the wiring substrate of First Embodiment.
Figure 13:
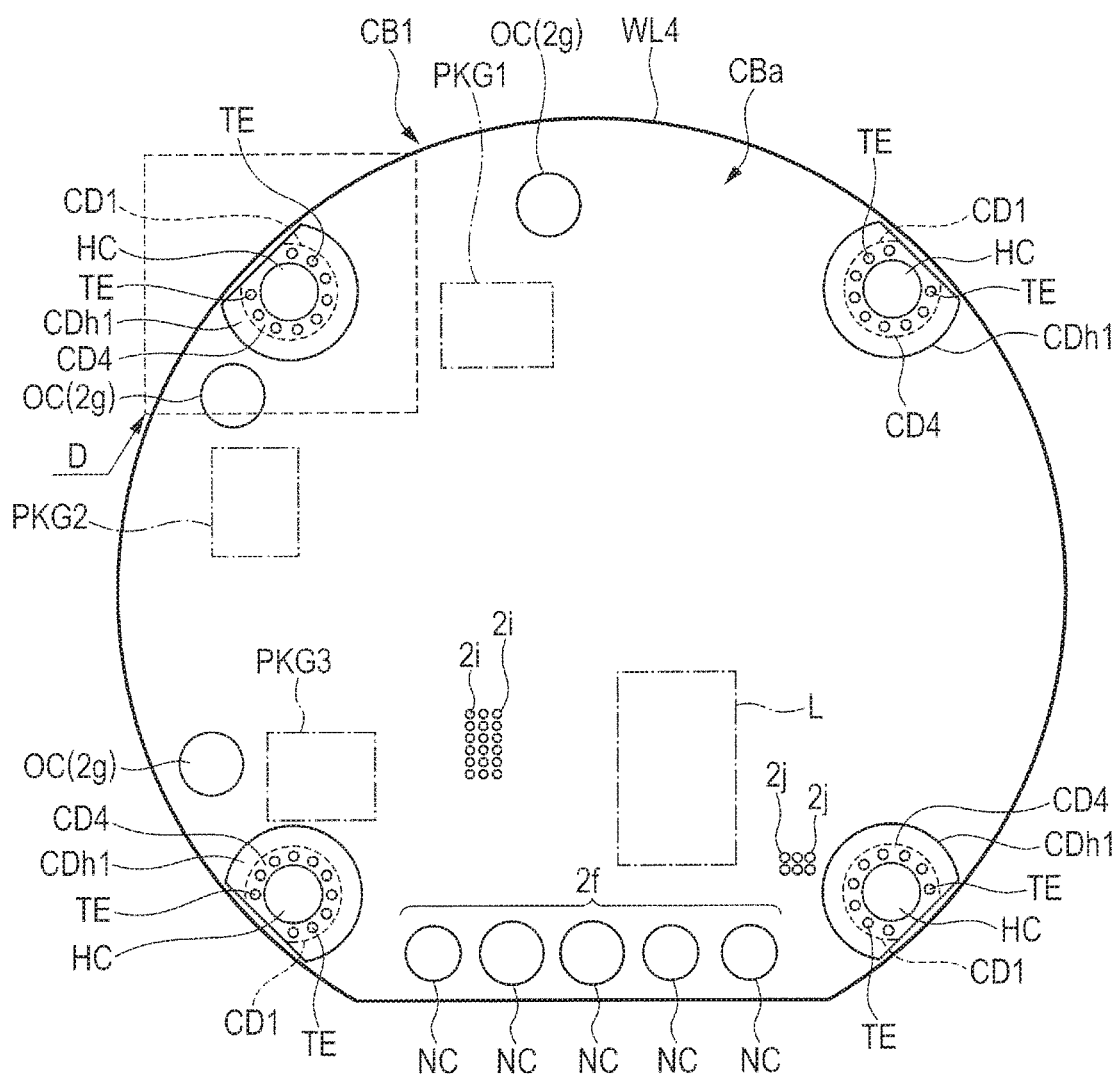
FIG. 13 is a plan view showing a structure of a fourth wiring layer of the wiring substrate of First Embodiment.
Figure 14:
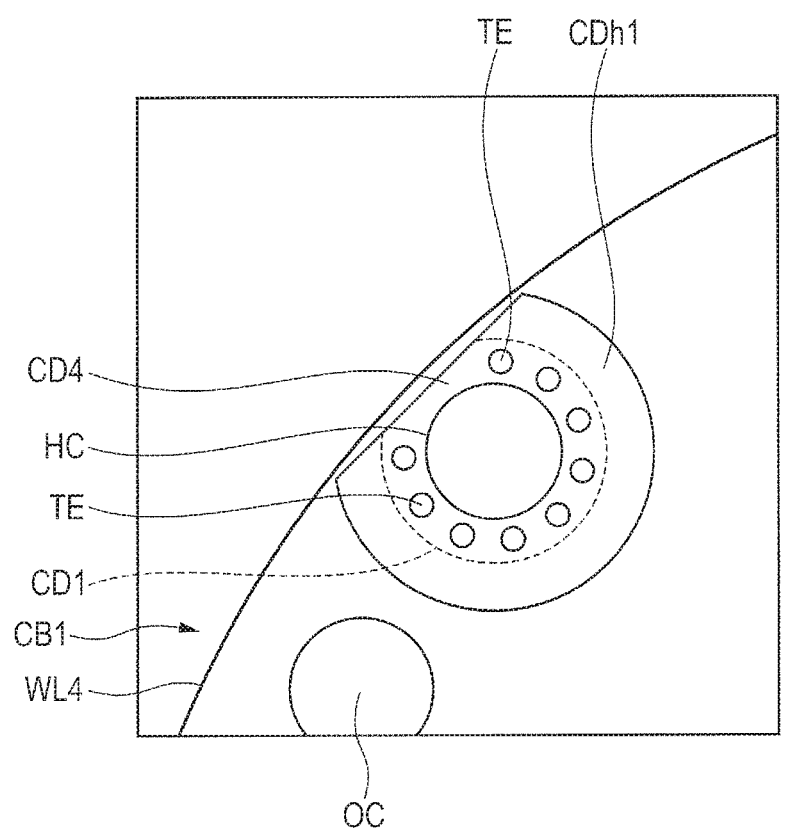
FIG. 14 is a partially enlarged plan view showing a structure of a part D in FIG. 13 on an enlarged scale.
Figure 15:
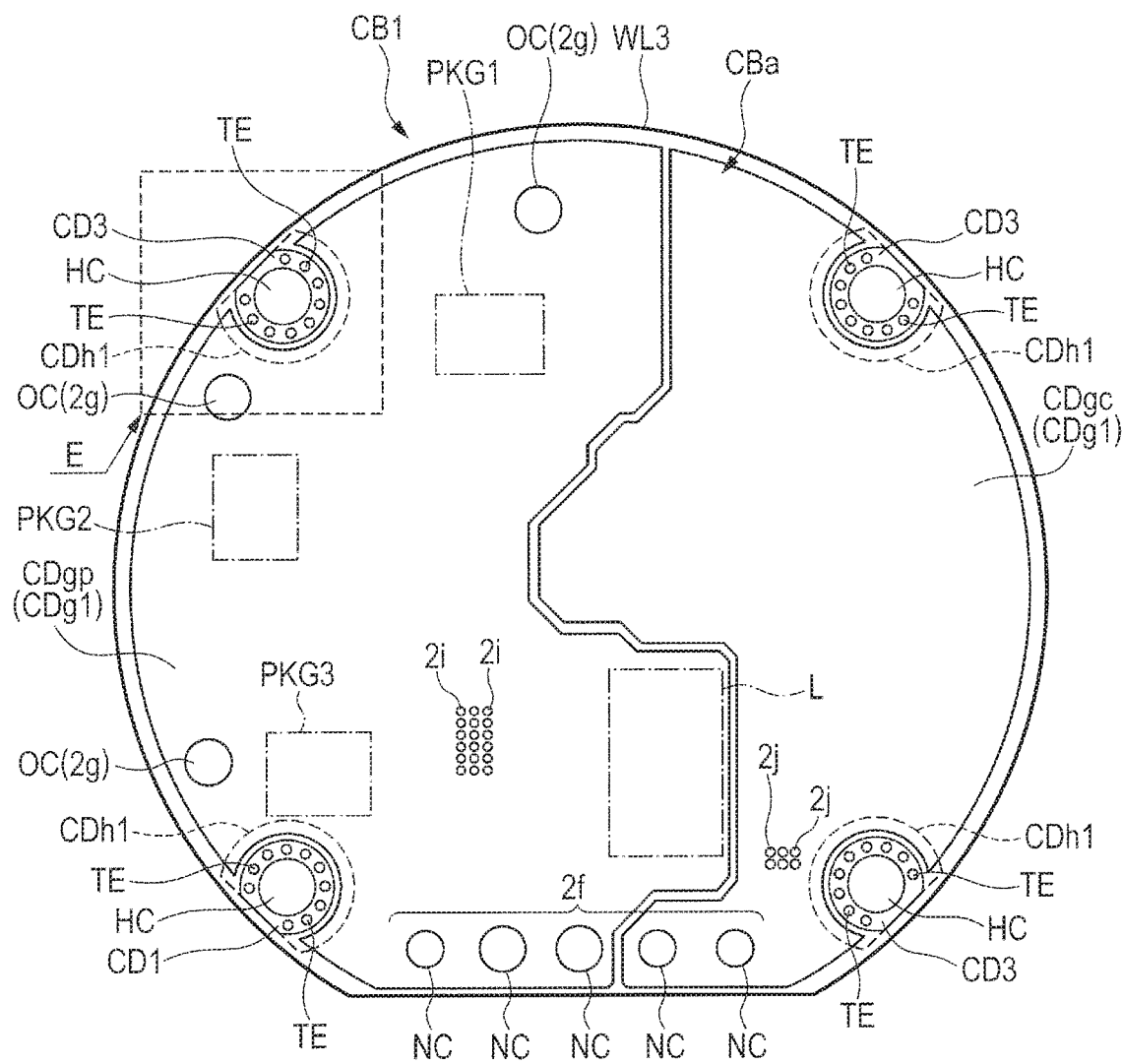
FIG. 15 is a plan view showing a structure of a third wiring layer of the wiring substrate of First Embodiment.
Figure 16:
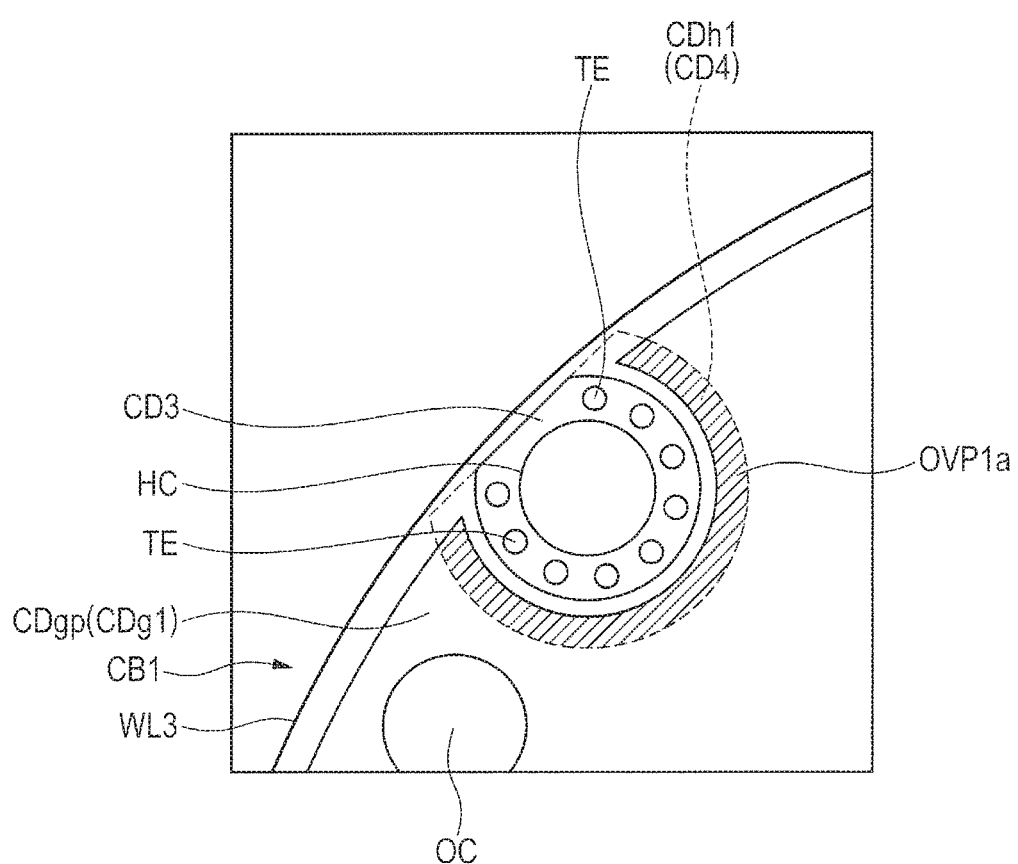
FIG. 16 is a partially enlarged plan view showing a structure of a part E in FIG. 15 on an enlarged scale.

Then, referring to FIGS. 9 to 16, a description will be given to the structure of the wiring substrate CB1 and the fixed structure of the wiring substrate CB1 of the present First Embodiment. FIG. 9 is a perspective view showing the surface side of the wiring substrate to be mounted in the electronic device of FIG. 1; FIG. 10 is a partially enlarged cross sectional view showing a structure of the wiring substrate at apart C in FIG. 9; FIG. 11 is a partially enlarged cross sectional view showing a fixed structure of the wiring substrate at the part C in FIG. 9; FIG. 12 is a plan view showing a structure of a first wiring layer of the wiring substrate of First Embodiment; FIG. 13 is a plan view showing a structure of a fourth wiring layer of the wiring substrate of First Embodiment; FIG. 14 is a partially enlarged plan view showing a structure of the part D in FIG. 13 on an enlarged scale; FIG. 15 is a plan view showing a structure of a third wiring layer of the wiring substrate of First Embodiment; and FIG. 16 is a partially enlarged plan view showing a structure of a part E in FIG. 15 on an enlarged scale.

First, a description will be given to the entire structure of the wiring substrate CB1 of the present First Embodiment. As shown in FIG. 9, the wiring substrate CB1 is formed in a substantially disk shape, and has a front surface CBa, aback surface CBb opposite to the front surface CBa, and a plurality of wiring layers arranged between the front surface CBa and the back surface CBb. A description will be given by taking the case where the wiring substrate CB1 of the present First Embodiment is a subtractive substrate having four wiring layers as an example. Incidentally, as shown in FIG. 9, at the front surface CBa of the wiring substrate CB1, the MCU 7, the predriver 8, the regulator 9, a zero C2 resistor 11, and other elements (not shown) are mounted. Further, at the the circumferential part of the wiring substrate CB1, through holes HC opening in the front surface CBa and the back surface CBb are formed. Further, at the circumferential part of the wiring substrate CB1, a coupling through hole 2f including an externally inputting coupling terminal NC, and a coupling through hole 2g including a coupling terminal OC for output to the motor 5 are formed.

Then, a description will be given to the internal structure of the wiring substrate CB1. The wiring substrate CB1 is, for example, a resin substrate. As shown in FIG. 10, the wiring substrate CB1 has an insulation layer (first base material layer or core layer) IL1, an insulation layer (second base material layer or prepreg layer) IL2a formed over the upper surface CBab of the insulation layer IL1, and an insulation layer (second base material layer or prepreg layer) IL2b formed over the lower surface CBba of the insulation layer IL1. The insulation layer IL1 includes, for example, a material obtained by impregnating a glass fiber or a carbon fiber with an epoxy type or a polyimide type thermosetting resin. The insulation layers IL2a and IL2b each include, for example, a prepreg of an epoxy type or polyimide type thermosetting resin. The film thickness of the insulation layer IL1 is, for example, 1 mm, and each film thickness of the insulation layers IL2a and IL2b is, for example, 200 μm.

Further, over the upper surface CBaa of the insulation layer IL2a, a wiring layer (first wiring layer) WL1 is formed. Over the upper surface CBab of the insulation layer IL1, a wiring layer (second wiring layer) WL2 is formed. Over the lower surface CBba of the insulation layer IL1, a wiring layer (third wiring layer) WL3 is formed. Over the lower surface CBbb of the insulation layer IL2b, a wiring layer (fourth wiring layer) WL4 is formed. Namely, the wiring substrate CB1 has four wiring layers of the wiring layers WL1, WL2, WL3, and WL4 from the front surface CBa side toward the back surface CBb side. Therefore, of the four wiring layers, the wiring layer WL2 and the wiring layer WL3 are wiring layers formed (arranged) in the inside of the substrate. In the wiring layers WL1, WL2, WL3, and WL4, conductor patterns (conductive films) are formed, respectively. The conductor pattern is formed of, for example, copper. Specifically, at the wiring substrate CB1 of First Embodiment, at the wiring layer WL3, a ground (GND) pattern (first conductor pattern or conductive film) CDg1 is formed. Whereas, at the wiring layer WL4, a heat radiation pattern (second conductor pattern or conductive film) CDh1 is formed. In the present First Embodiment, in the thickness direction of the wiring substrate CB1, the ground pattern CDg1 and the heat radiation pattern CDh1 overlap each other. Then, the heat radiation pattern CDh1 is not electrically coupled with any component mounted over the wiring substrate CB1, and is also not electrically coupled with the ground pattern CDg1. Further, although not shown, the heat radiation pattern CDh1 is also not electrically coupled with the power supply pattern (the conductor pattern to be supplied with a power supply potential) formed at the wiring substrate CB1.

Further, at the wiring layer WL1, a heat radiation pattern (third conductor pattern or conductive film) CD1 is formed; at the wiring layer WL2, a heat radiation pattern (third conductor pattern or conductive film) CD2; at the wiring layer WL3, a heat radiation pattern (third conductor pattern or conductive film) CD3; and at the wiring layer WL4, a heat radiation pattern (third conductor pattern or conductive film) CD4. The heat radiation patterns CD1, CD2, CD3, and CD4 can be each used as a land. Although described in details later, the heat radiation patterns CD1, CD2, CD3, and CD4 are formed in a ring shape along the outer circumference of the through hole HC formed at the circumferential part of the wiring substrate CB1 (in such a manner as to surround the through hole HC). The heat radiation patterns CD1, CD2, CD3, and CD4 are formed in the same shape and with the same dimensions, and overlap each other in the thickness direction of the wiring substrate CB1. Each area of the heat radiation patterns CD1, CD2, CD3, and CD4 is, for example, 16 mm².

At the wiring substrate CB1 of First Embodiment, the heat radiation pattern CD4 and the heat radiation pattern CDh1 are integrally formed. Namely, the heat radiation pattern CD4 and the heat radiation pattern CDh1 are electrically coupled with each other. Incidentally, at the wiring substrate CB1 of First Embodiment, the heat radiation patterns CD1, CD2, CD3, and CD4 are not electrically coupled with the projection BS of the main body part 1b (housing HS), the screw BT, and the washer WS.

Further, the wiring substrate CB1 has a through hole (second through hole) TH penetrating from the upper surface CBaa of the insulation layer IL2a including the wiring layer WL1 formed therein toward the lower surface CBbb of the insulation layer IL2b including the wiring layer WL4 formed therein, and a through electrode TE formed in the inside of the through hole TH. The through electrode TE is formed by filling the through hole TH with a conductive paste CP. Further, at the inner circumferential wall of the through hole TH, a through hole plating TP is formed. A plurality of through holes TH and through electrodes TE are formed along the outer circumference of the through hole HC formed at the circumferential part of the wiring substrate CB1 (in such a manner as to surround the through hole HC). The through hole TH and the through electrode TE penetrate through respective parts of the heat radiation patterns CD1, CD2, CD3, and CD4, and are electrically coupled via the through hole plating TP with the heat radiation patterns CD1, CD2, CD3, and CD4.

Further, over the upper surface CBaa of the insulation layer IL2a, an insulation layer (resist layer) IL3a is formed in such a manner as to cover the heat radiation pattern CD1. Over the lower surface CBbb of the insulation layer IL2b, an insulation layer (resist layer) IL3b is formed in such a manner as to cover the heat radiation pattern CD4. The insulation layers IL3a and IL3b are each a solder resist formed of an epoxy type or polyimide type thermosetting resin. Each film thickness of the insulation layers IL3a and IL3b is, for example, 30 μm.

Then, a description will be given to the fixed structure of the wiring substrate CB1 to the housing HS in the electronic device ED1. Incidentally, the structure shown in FIG. 11 shows the fixed structure of the part C of the wiring substrate CB1 in the through hole HC shown in FIG. 9.

As shown in FIG. 11, the wiring substrate CB1 is fixed to the projection BS by screwing of the screw BT inserted into the through hole HC via the washer WS into the screw hole SH formed in the projection BS of the main body part 1b. At this step, at the peripheral part of the through hole HC, the back surface CBb of the wiring substrate CB1 and the projection BS come in contact with each other. As a result, the wiring substrate CB1 is supported by the main body part 1b.

Further, as described previously, the semiconductor device PKG1 forming the power MOSFET 15a and the power MOSFET 15b is arranged on the back surface CBb side of the wiring substrate CB1. Still further, as described previously, at the wiring layer WL3, the ground pattern CDg1 is formed. Whereas, at the wiring layer WL4, a heat radiation pattern CDh1 is formed. As shown in FIG. 11, in the present First Embodiment, in the thickness direction of the wiring substrate CB1, the semiconductor device PKG1 and the ground pattern CDg1 overlap each other. Further, in the thickness direction of the wiring substrate CB1, the ground pattern CDg1 and the heat radiation pattern CDh1 overlap each other. Whereas, in the thickness direction of the wiring substrate CB1, the heat radiation pattern CDh1 and the projection BS formed at the main body part 1b overlap each other. Namely, the heat radiation pattern CDh1 overlaps the region where the back surface CBb of the wiring substrate CB1 and the projection BS (housing HS) are in contact with each other. Herein, the region where the ground pattern CDg1 and the heat radiation pattern CDh1 overlap each other is expressed as an overlap part OVP1a, and the region where the heat radiation pattern CDh1 and the projection BS overlap each other is expressed as an overlap part OVP1b. As described previously, the ground pattern CDg1 and the heat radiation pattern CDh1 are not electrically coupled with each other. Incidentally, at the wiring substrate CB1 of First Embodiment, the ground pattern CDg1 is not electrically coupled with the projection BS (housing HS) of the main body part 1b, the screw BT, and the washer WS. Similarly, the heat radiation pattern CDh1 is not electrically coupled with the projection BS (housing HS) of the main body part 1b, the screw BT, and the washer WS.

Further, as shown in FIG. 11, in the thickness direction of the wiring substrate CB1, the heat radiation pattern CD4 and the projection BS formed at the main body part 1*b* overlap each other. Namely, the heat radiation pattern CD4 overlaps the region where the back surface CBb of the wiring substrate CB1 and the projection BS (housing HS) are in contact with each other. As described previously, the heat radiation pattern CD4 is integrally formed with the heat radiation pattern CDh1. For this reason, the overlap part OVP1*b* shown in FIG. 11 also includes the region where the heat radiation pattern CD4 and the projection BS overlap each other.

Then, each wiring layer of the wiring substrate CB1 will be described in more details. First, the wiring layer WL1 of the wiring substrate CB1 will be described. FIG. 12 is a plan view of the wiring layer WL1 of the wiring substrate CB1 as seen from the front surface CBa side.

As shown in FIG. 12, at the wiring layer WL1 of the wiring substrate CB1, the heat radiation patterns CD1 are formed at four sites of the circumferential part of the wiring substrate CB1. As described previously, the heat radiation pattern CD1 is formed in a ring shape along the outer circumference of the through hole HC (in such a manner as to surround the through hole HC). Further, a plurality of through electrodes TE each penetrate through a part of the heat radiation pattern CD1 along the thickness direction. Further, at the wiring layer WL1 of the wiring substrate CB1, a power type ground wiring pattern (conductor pattern or conductive film) 18, and the control type ground wiring pattern (conductor pattern or conductive film) 19 are formed. The power type ground wiring pattern 18 and the control type ground wiring pattern 19 are one-point coupled by the zero Ω resistor 11. Incidentally, the power type ground wiring pattern 18 is coupled via a plurality of through electrodes 2*i* to the power type ground pattern (conductor pattern or conductive film) CDgp forming the ground pattern CDg1 shown in FIG. 15. Whereas, the control type ground wiring pattern 19 is coupled via a plurality of through electrodes 2*j* to the control type ground pattern (conductor pattern or conductive film) CDgc forming the ground pattern CDg1 shown in FIG. 15. Further, as shown in FIG. 12, at the circumferential part of the wiring substrate CB1, a coupling through hole 2*f* formed of an externally inputting coupling terminal NC, and a coupling through hole 2*g* formed of an outputting coupling terminal OC to the motor 5 shown in FIG. 6 are formed. Below, the foregoing through hole HC, through electrode TE, through electrode 2*i*, through electrode 2*j*, inputting coupling terminal NC, and outputting coupling terminal OC penetrate from the front surface CBa side to the back surface CBb side of the wiring substrate CB1, and hence, are configurations common among the wiring layers WL1, WL2, WL3, and WL4, and a description for other wiring layers is omitted. Incidentally, in FIG. 12, the MCU 7, the predriver 8, the regulator 9, and the zero Ω resistor 11 mounted at the front surface CBa at a layer higher than the wiring layer WL1 of the wiring substrate CB1 are indicated with a dashed line.

Incidentally, although not shown, at the wiring layer WL1, a conductor pattern for wiring the MCU 7, the predriver 8, the regulator 9, and the like mounted at the front surface CBa of the wiring substrate CB1 is formed.

Then, a description will be given to the wiring layer WL4 of the wiring substrate CB1. FIGS. 13 and 14 are each a plan view of the wiring layer WL4 of the wiring substrate CB1 as seen from the front surface CBa side.

As shown in FIG. 13, at the wiring layer WL4 of the wiring substrate CB1, the heat radiation patterns CD4 are formed at four sites of the circumferential part of the wiring substrate CB1. As described previously, the heat radiation pattern CD4 is formed in a ring shape along the outer circumference of the through hole HC (in such a manner as to surround the through hole HC). Further, as shown in FIG. 13, at the wiring layer WL4 of the wiring substrate CB1, the heat radiation patterns CDh1 are formed at four site of the circumferential part of the wiring substrate CB1. The heat radiation pattern CDh1 is formed in a ring shape in such a manner as to expand radially and outwardly from the outer circumference edge of the heat radiation pattern CD4. As shown in FIGS. 13 and 14, the heat radiation pattern CD4 of the wiring layer WL4 is formed in the same shape and with the same dimensions as those of the heat radiation pattern CD1 of the wiring layer WL1 (indicated with a broken line in FIGS. 13 and 14). Further, the heat radiation pattern CDh1 is integrally formed with the heat radiation pattern CD4. Namely, the heat radiation pattern CD4 and the heat radiation pattern CDh1 are electrically coupled with each other. Incidentally, the heat radiation pattern CDh1 can also be regarded as the extension of the heat radiation pattern CD4. Further, the overall combination of the heat radiation pattern CDh1 and the heat radiation pattern CD4 can also be regarded as the heat radiation pattern CDh1.

Incidentally, in FIG. 13, the semiconductor devices PKG1, PKG2, and PKG3, and the coil L mounted at the back surface CBb at a lower layer than the wiring layer WL4 of the wiring substrate CB1 are indicated with a dashed line. Although not shown, at the wiring layer WL4, a conductor pattern for wiring the semiconductor devices PKG1, PKG2, and PKG3, the coil L, and the like mounted at the back surface CBb of the wiring substrate CB1 is formed.

Then, a description will be given to the wiring layer WL3 of the wiring substrate CB1. FIGS. 15 and 16 are each a plan view of the wiring layer WL3 of the wiring substrate CB1 as seen from the front surface CBa side.

As shown in FIG. 15, at the wiring layer WL3 of the wiring substrate CB1, the heat radiation patterns CD3 are formed at four sites of the circumferential part of the wiring substrate CB1. As described previously, the heat radiation pattern CD3 is formed in a ring shape along the outer circumference of the through hole HC (in such a manner as to surround the through hole HC). As shown in FIGS. 15 and 16, the heat radiation pattern CD3 of the wiring layer WL3 is formed in the same shape and with the same dimensions as those of the heat radiation pattern CD4 of the wiring layer WL4.

Further, at the wiring layer WL3, a ground pattern CDg1 is formed entirely over the main surface of the wiring substrate CB1 except for the region where the heat radiation pattern CD3, the through hole HC, the through electrode TE, the through electrode 2*i*, the through electrode 2*j*, the inputting coupling terminal NC, and the outputting coupling terminal OC are formed. Namely, the wiring layer WL3 is a ground plane for electric components mounted at the wiring substrate CB1. The ground pattern CDg1 is formed entirely over the main surface of the wiring substrate CB1 in order to reduce the impedance. Further, the ground pattern CDg1 is formed of a power type ground pattern CDgp and a control type ground pattern CDgc. Further, the heat radiation pattern CD3, the power type ground pattern CDgp, and the control type ground pattern CDgc are not electrically coupled, respectively.

Incidentally, in FIG. 15, the semiconductor devices PKG1, PKG2, and PKG3, and the coil L mounted at the back surface CBb at a lower layer than the wiring layer WL4 of the wiring substrate CB1 are indicated with a dashed line. The semiconductor devices PKG1, PKG2, and PKG3, and the coil L overlap the ground pattern CDg1 in the thickness direction (plan view) of the wiring substrate CB1. Specifically, the semiconductor devices PKG1, PKG2, and PKG3, and the coil L overlap the power type ground pattern CDgp in the thickness direction (plan view) of the wiring substrate CB1. Further, the semiconductor devices PKG1, PKG2, and PKG3 are electrically coupled with the power type ground pattern CDgp of the wiring layer WL3.

Further, in FIGS. 15 and 16, the heat radiation pattern CDh1 of the wiring layer WL4 is indicated with a broken line. As shown in FIGS. 15 and 16, the heat radiation pattern CDh1 overlaps the ground pattern CDg1 in the thickness direction (plan view) of the wiring substrate CB1. Specifically, of the heat radiation patterns CDh1 at the four sites, the heat radiation patterns CDh1 at the two sites on the left side in FIG. 15 overlap the power type ground pattern CDgp, and the heat radiation patterns CDh1 at the two sites on the right side in FIG. 15 overlap the control type ground pattern CDgc. Herein, as described previously, at the wiring substrate CB1 of First Embodiment, the region where the heat radiation pattern CDh1 and the power type ground pattern CDgp overlap each other, namely, the overlap part OVP1a is the region in a substantially C shape indicated with a diagonally shaded part in FIG. 16.

Herein, in the electronic device ED1 of the present First Embodiment, at the wiring layer WL3, the power type ground pattern CDgp and the control type ground pattern CDgc are isolated from each other, and at the wiring layer WL1, the power type ground wiring pattern 18 and the control type ground wiring pattern 19 are one-point coupled with each other by the zero Ω resistor 11. For this reason, the power type ground and the control type ground are in high impedance coupling. This can, for example, suppress the propagation of the common-mode noise passing through the power type ground wiring pattern 18 to the control type ground wiring pattern 19, which can prevent the malfunction of a control type circuit.

Incidentally, although not shown, the wiring layer WL2 of the wiring substrate CB1 of the present First Embodiment is a power supply plane including a power supply pattern (conductor pattern or conductive film) for supplying a power supply to the electronic components mounted at the wiring substrate CB1, formed therein.

<Description of Study Example>

Figure 17:
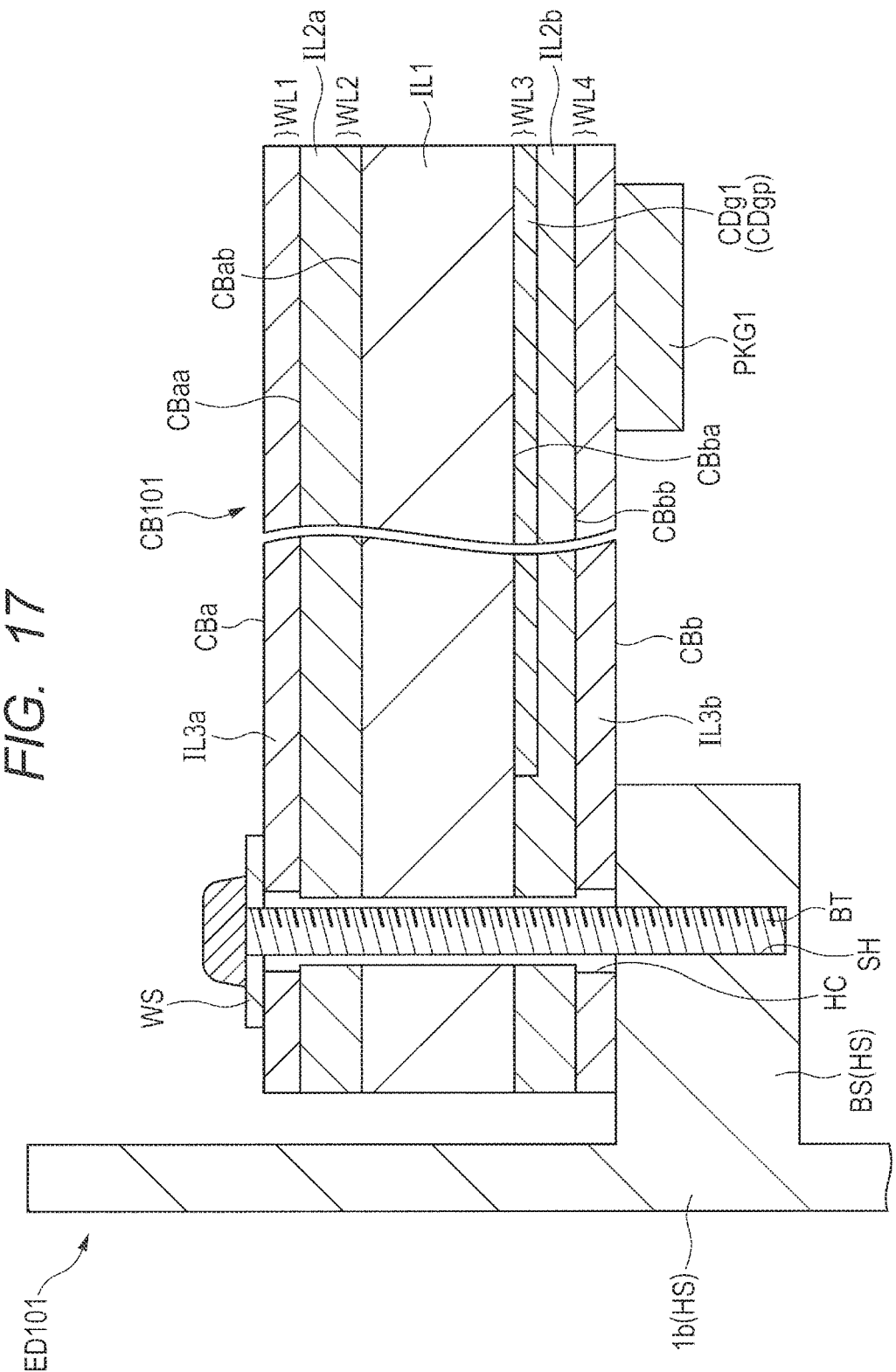
FIG. 17 is a partially enlarged cross sectional view showing a fixed structure of a wiring substrate of Study Example 1.
Figure 18:
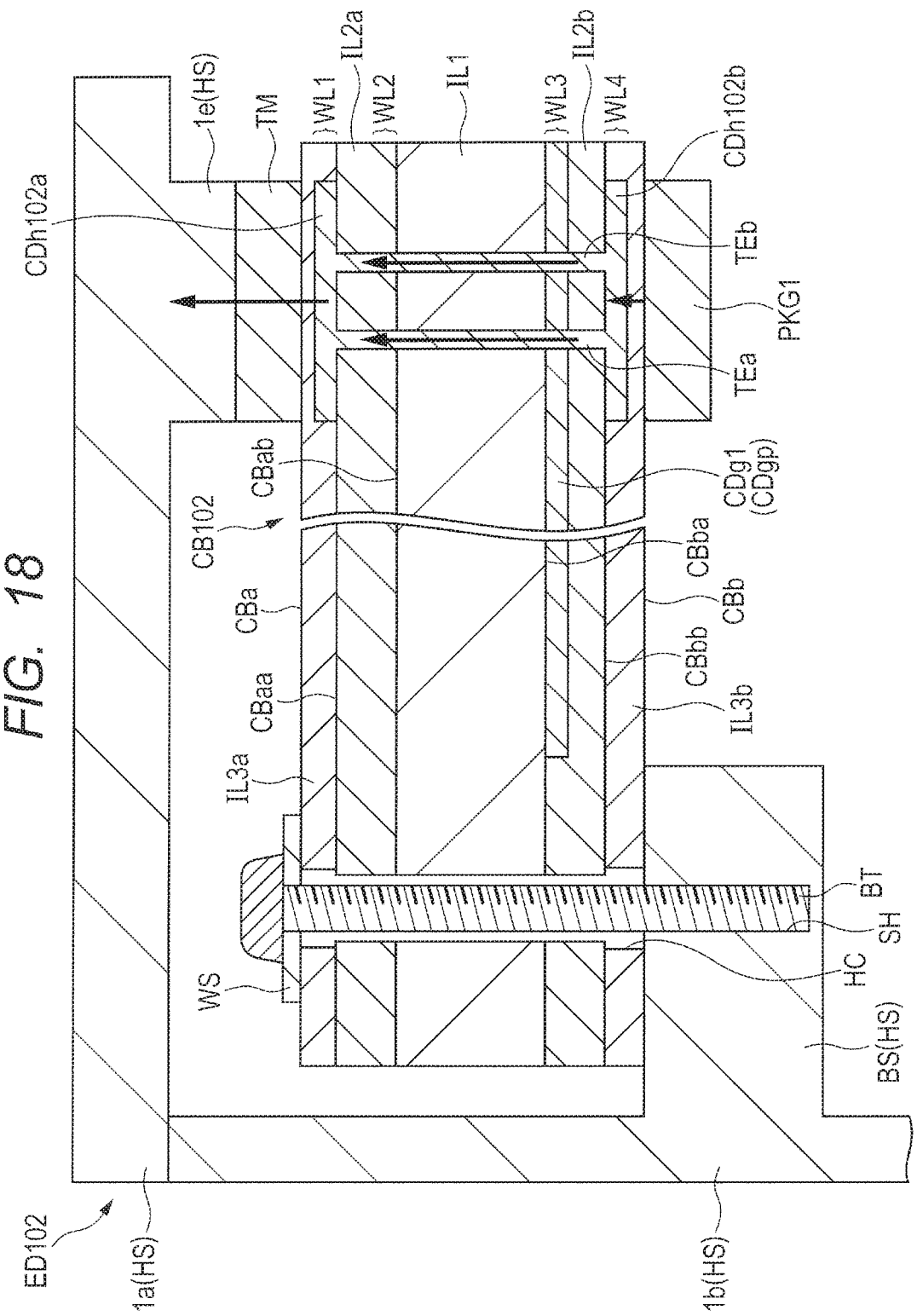
FIG. 18 is a partially enlarged cross sectional view showing a fixed structure of a wiring substrate of Study Example 2.

The configuration of an electronic device of Study Example studied by the present inventors will be described by reference to FIGS. 17 and 18. FIG. 17 is a partially enlarged cross sectional view showing the fixed structure of the wiring substrate in an electronic device ED101 of Study Example 1. FIG. 18 is a partially enlarged cross sectional view showing the fixed structure of the wiring substrate in an electronic device ED102 of Study Example 2.

As shown in FIG. 17, the electronic device ED101 of Study Example 1 has a wiring substrate CB101 in which electronic components are mounted at the wiring substrate (substrate), and a housing HS made of a metal for supporting the wiring substrate CB101. Then, although not shown, a motor is incorporated in the electronic device ED101 as with the electronic device ED1 of First Embodiment. The wiring substrate CB101 is a substrate for supplying an electric power to the motor, and controlling the motor. The circuit configuration of the electronic device ED101 of Study Example 1 is the same as the circuit configuration of the electronic device ED1 of First Embodiment shown in FIG. 8.

Further, in the wiring substrate CB101 of Study Example 1, as with the wiring substrate CB1 of First Embodiment, through holes HC are formed at four sites of the circumferential part of the wiring substrate CB101. For this reason, as shown in FIG. 17, the wiring substrate CB101 is fixed to the projection BS (i.e., the housing HS) by screwing the screw BT inserted via a washer WS into the through hole HC to the screw hole SH formed at the projection BS of the main body part 1b.

Further, as shown in FIG. 17, the wiring substrate CB101 has, as with the wiring substrate CB1 of First Embodiment, a front surface (first main surface or upper surface) CBa, a back surface (second main surface or lower surface) CBb opposite to the front surface CBa, and four wiring layers WL1, WL2, WL3, and WL4 arranged between the front surface CBa and the back surface CBb. Then, at the front surface CBa of the wiring substrate CB101, as with the wiring substrate CB1 of First Embodiment, a MCU 7, a predriver 8, a regulator 9, a zero Ω resistor 11, and other elements (not shown) are mounted. Further, a semiconductor device PKG1 forming a power MOSFET 15a and a power MOSFET 15b shown in FIG. 8 is arranged on the back surface CBb side of the wiring substrate CB101. Further, a ground pattern CDg1 is formed at the wiring layer WL3.

On the other hand, as shown in FIG. 17, the wiring substrate CB101 of Study Example 1 does not have a heat radiation pattern CDh1, heat radiation patterns CD1, CD2, CD3, and CD4, and a through electrode TE as distinct from the wiring substrate CB1 of First Embodiment shown in FIG. 11.

In the electronic device ED101 of Study Example 1 shown in FIG. 17, when a current passes through the electric component mounted at the wiring substrate CB101, heat is generated. The electronic component is degraded by the heat, resulting in a shorter life. For this reason, it becomes necessary to release the heat generated from the electronic component mounted at the wiring substrate CB101. Particularly, in the electronic device ED101 of Study Example 1, the power MOSFETs 15a, 15b, and the like (see FIG. 8) mounted at the wiring substrate CB101 form a power type circuit configuration part 16 (more specifically, an inverter circuit 14). For this reason, a large current passes through the semiconductor device PKG1 forming the power MOSFETs 15a and 15b, the semiconductor device PKG2 forming the power MOSFETs 15c and 15d, and the semiconductor device PKG3 forming the power MOSFETs 15e and 15f. Further, similarly, a large current also passes through the coil L forming the power type circuit configuration part 16. For this reason, the semiconductor devices PKG1, PKG2, and PKG3, and the coil L produce a high heat value during operation. Therefore, in the electronic device ED101 of Study Example 1, the semiconductor devices PKG1, PKG2, and PKG3, and the coil L become the main heat sources.

Herein, the housing HS forming the electronic device ED101 of Study Example 1 is made of a metal, and hence acts as a heat sink. For this reason, in the electronic device ED101 of Study Example 1, desirably, the heat of the semiconductor devices PKG1, PKG2, and PKG3, and the coil L is released to the housing HS, thereby to reduce the temperatures of the semiconductor devices PKG1, PKG2, and PKG3, and the coil L with efficiency.

As shown in FIG. 17, the wiring substrate CB101 of Study Example 1 has only four contact sites between the wiring substrate CB101 and the housing HS in the vicinity of each through hole HC. The through holes HC are formed at the circumferential part of the wiring substrate CB101, and hence are at a long distance from the elements such as semiconductor devices PKG1, PKG2, and PKG3, and the coil L. For this reason, in the electronic device ED101 of Study Example 1, the efficiency of heat conduction, namely, the heat radiation efficiency from the semiconductor devices PKG1, PKG2, and PKG3, the coil L, and the like to the housing HS is low. For this reason, the heat generated from the semiconductor devices PKG1, PKG2, and PKG3, the coil L, and the like is enclosed in the wiring substrate CB101. This may deteriorate the electronic components mounted at the wiring substrate CB101, resulting in the instability of the performances of the electronic device ED101. As a result, the reliability of the electronic device ED101 may be reduced.

Then, a description will be given to an electronic device ED102 of Study Example 2 shown in FIG. 18. In the electronic device ED102 of Study Example 2, the following configuration is added to that of the electronic device ED101 of Study Example 1. As shown in FIG. 18, the electronic device ED102 of Study Example 2 has a heat radiation material TM on the front surface CBa side of the wiring substrate CB102. The heat radiation material TM is interposed between the wiring substrate CB102 and the cover 1a arranged at the top of the main body part 1b. The heat radiation material TM is formed of a TIM (Thermal Interface Material) made of a resin with a high thermal conductivity. As shown in FIG. 18, the heat radiation material TM is arranged at a position overlapping the semiconductor device PKG1 arranged on the back surface CBb side of the wiring substrate CB102 in the thickness direction of the wiring substrate CB102.

Further, a heat radiation pattern (conductor pattern or conductive film) CDh102a is formed at the wiring layer WL1; and a heat radiation pattern (conductor pattern or conductive film) CDh102b, at the wiring layer WL4. The heat radiation pattern CDh102a is formed at a position overlapping the semiconductor device PKG1 in the thickness direction of the wiring substrate CB102; and the heat radiation pattern CDh102b, at a position overlapping the heat radiation material TM in the thickness direction of the wiring substrate CB102. Further, through electrodes TEa and TEb penetrating from the upper surface CBaa of the insulation layer IL2a including the wiring layer WL1 formed therein toward the lower surface CBbb of the insulation layer IL2b including the wiring layer WL4 formed therein are formed. The heat radiation pattern CDh102a and the heat radiation pattern CDh102b are electrically coupled with each other via the through electrodes TEa and TEb.

Namely, in the electronic device ED102 of Study Example 2, the semiconductor device PKG1 and the heat radiation pattern CDh102b, and the heat radiation pattern CDh102a and the heat radiation material TM overlap each other, respectively in the thickness direction of the wiring substrate CB102, and the heat radiation pattern CDh102a and the heat radiation pattern CDh102b are coupled by the through electrodes TEa and TEb. Incidentally, although not shown, the wiring substrate CB102 of Study Example 2 has, for the semiconductor devices PKG2 and PKG3, heat radiation patterns, through electrodes, and a heat radiation material with the same configurations as those of the heat radiation patterns CDh102a and CDh102b, the through electrodes TEa and TEb, and the heat radiation material TM for the semiconductor device PKG1.

In the electronic device ED102 of Study Example 2, the heat generated from the semiconductor device PKG1 is transmitted via the insulation layer IL3b to the heat radiation pattern CDh102b. Then, the heat transmitted to the heat radiation pattern CDh102b is transmitted via the through electrodes TEa and TEb to the heat radiation pattern CDh102a. Then, the heat transmitted to the heat radiation pattern CDh102a is transmitted via the insulation layer IL3a to the heat radiation material TM. The heat transmitted to the heat radiation material TM is transmitted to the cover 1a made of a metal, and diffuses to the entire housing HS including the main body part 1b arranged at the underlying part of the cover 1a. The foregoing heat radiation path is indicated with arrows in FIG. 18. Further, as described previously, the electronic device ED102 of Study Example 2 has, for the semiconductor devices PKG2 and PKG3, heat radiation pattern, through electrodes, and a heat radiation material with the same configurations as those of the heat radiation patterns CDh102a and CDh102b, the through electrodes TEa and TEb, and the heat radiation material TM. For this reason, the heat generated from the semiconductor devices PKG2 and PKG3 also diffuses, as with the foregoing description, via the heat radiation patterns, the through electrodes, and the heat radiation material to the entire housing HS.

From the description up to this point, with the electronic device ED102 of Study Example 2, the heat generated from the semiconductor devices PKG1, PKG2, and PKG3 can be released to the housing HS with efficiency, resulting in the reduction of the temperatures of the semiconductor devices PKG1, PKG2, and PKG3.

Herein, a description will be given to the problem for Study Example 2 found by the present inventors. First, principally, for the electronic device ED102 of the Study Example 2, an increase in manufacturing cost is expected as much as the cost required for the heat radiation material TM as compared with the electronic device ED101 of Study Example 1.

Secondly, the heat radiation material TM is required to be brought into contact (pressing contact) with the wiring substrate CB102. For this reason, at the front surface CBa of the wiring substrate CB102, other electronic components than the heat radiation material TM cannot be arranged in the region where the heat radiation material TM is arranged. When the electronic components cannot be arranged in the region where the heat radiation material TM is arranged, the layout on the front surface CBa side of the wiring substrate CB102 is restricted, and hence the design of the electronic device ED102 becomes difficult. Further, the fact that the electronic components cannot be arranged in the region where the heat radiation material TM is arranged is disadvantageous for miniaturization of the electronic device ED102.

Thirdly, for the electronic device ED102 of Study Example 2, in order to allow the heat radiation effect by the heat radiation material TM to be exerted, the heat radiation material TM is required to be brought into contact (pressing contact) with the wiring substrate CB102. For this reason, for example, the semiconductor device PKG1 is arranged on the front surface CBa side of the wiring substrate CB102, and the heat radiation material TM is arranged between the semiconductor device PKG1 and the cover 1a. As a result, the heat radiation material TM imposes a load on the semiconductor device PKG1, which deteriorates the reliability of the semiconductor device PKG1. This imposes a restriction on the electronic device ED102 of Study Example 2 that the semiconductor device PKG1 must be arranged on the back surface CBb side of the wiring substrate CB102. This problem also present similarly for the semiconductor devices PKG2 and PKG3.

From the description up to this point, for the electronic device ED102 of Study Example 2, desirably, without using the heat radiation material TM, the heat generated at the semiconductor devices PKG1, PKG2, and PKG3, and the like is released to the housing HS with efficiency, thereby to reduce the temperatures of the electronic components mounted at the wiring substrate CB102 including the semiconductor devices PKG1, PKG2, and PKG3.

<Main Features of Embodiments>

As shown in FIGS. 11 to 16, one of the main features of the electronic device ED1 of the present First Embodiment is as follows: the heat radiation pattern CDh1 is formed at the wiring layer WL4, and in the thickness direction of the wiring substrate CB1, the heat radiation pattern CDh1 overlaps the ground pattern CDg1, and the heat radiation pattern CDh1 overlaps the projection BS (i.e., the region where the back surface CBb of the wiring substrate CB1 and the housing HS are in contact with each other) formed at the main body part 1b. In the present embodiment, by adopting such a configuration, it is possible to improve the reliability of the electronic device. Below, the reason will be specifically described.

As shown in FIG. 11, for the wiring substrate CB1 of the present First Embodiment, in the thickness direction of the wiring substrate CB1, the semiconductor device PKG1 and the ground pattern CDg1 overlap each other. More specifically, in the thickness direction of the wiring substrate CB1, the semiconductor device PKG1 and the power type ground pattern CDgp overlap each other. Further, in the thickness direction of the wiring substrate CB1, the ground pattern CDg1 and the heat radiation pattern CDh1 overlap each other. Still further, in the thickness direction of the wiring substrate CB1, the heat radiation pattern CDh1 and the projection BS formed at the main body part 1b overlap each other. Namely, the heat radiation pattern CDh1 overlaps the region where the back surface CBb of the wiring substrate CB1 and the projection BS (housing HS) are in contact with each other. A conductor has a higher thermal conductivity than that of an insulator. For this reason, when conductive films (heat radiation patterns or ground patterns) overlap each other in the thickness direction, the thermal conductivity between the conductive films increases.

As shown in FIG. 11, for the electronic device ED1 of the present First Embodiment, the heat generated from the semiconductor device PKG1 is transmitted via the insulation layer IL3b and the insulation layer IL2b to the ground pattern CDg1. Then, the heat transmitted to the ground pattern CDg1 diffuses into the ground pattern CDg1, and is transmitted to the heat radiation pattern CDh1 overlapping the ground pattern CDg1 in the thickness direction of the wiring substrate CB1 via the insulation layer IL2b (overlap part OVP1a). Then, the heat transmitted to the heat radiation pattern CDh1 diffuses into the heat radiation pattern CDh1. Herein, the heat radiation pattern CDh1 overlaps the region where the back surface CBb of the wiring substrate CB1 and the projection BS are in contact with each other. Namely, the heat radiation pattern CDh1 is in the proximity of the projection BS of a conductor. For this reason, a heat is transmitted to the projection BS of the main body part 1b overlapping the heat radiation pattern CDh1 in the thickness direction of the wiring substrate CB1 via the insulation layer IL3b (overlap part OVP1b). The heat transmitted to the projection BS of the main body part 1b diffuses to the entire housing HS including the main body part 1b. The foregoing heat radiation path is indicated with arrows in FIG. 11.

Further, as described previously, in the electronic device ED1 of the present First Embodiment, other electronic components including the semiconductor devices PKG2 and PKG3, and the coil L also overlap the ground pattern CDg1 in the thickness direction of the wiring substrate CB1 (plan view). For this reason, the heat generated from the semiconductor devices PKG2 and PKG3, the coil L, and the like also diffuses to the entire housing HS via the ground pattern CDg1, the heat radiation pattern CDh1, and the projection in the same manner as described above.

Incidentally, as shown in FIG. 15, the ground pattern CDg1 is formed of a power type ground pattern CDgp and a control type ground pattern CDgc. The semiconductor devices PKG1, PKG2, and PKG3, and the coil L overlap the power type ground pattern CDgp in the thickness direction of the wiring substrate CB1 (plan view). For this reason, the heat generated from the semiconductor device PKG1, and the like is, first, transmitted to the power type ground pattern CDgp. The heat transmitted from the semiconductor device PKG1, and the like to the power type ground pattern CDgp is also transmitted to the near control type ground pattern CDgc. Thus, the heat is transmitted to the heat radiation patterns CDh1 at two sites overlapping the power type ground pattern CDgp, and the heat radiation patterns CDh1 at two sites overlapping the control type ground patterns CDgc in the thickness direction of the wiring substrate CB1. Then, the heat transmitted to the heat radiation patterns CDh1 is transmitted to the projection BS of the main body part 1b overlapping the heat radiation patterns CDh1 in the thickness direction of the wiring substrate CB1 via the insulation layer IL3b. The heat transmitted to the projection BS of the main body part 1b diffuses to the entire housing HS including the main body part 1b.

From the description up to this point, in the electronic device ED1 of the present First Embodiment, as shown in FIGS. 11 to 16, in the thickness direction of the wiring substrate CB1, the heat radiation pattern CDh1 overlaps the ground pattern CDg1, and the heat radiation pattern CDh1 also overlaps the projection BS formed at the main body part 1b (i.e., the region where the back surface CBb of the wiring substrate CB1 and the housing HS are in contact with each other). For this reason, without using the heat radiation material TM as with the electronic device ED102 of Study Example 2, the heat generated from the semiconductor devices PKG1, PKG2, and PKG3, the coil L, and the like can be released with efficiency via the ground pattern CDg1 and the heat radiation pattern CDh1 to the housing HS, thereby to reduce the temperatures of the electronic components mounted at the wiring substrate CB1 including the semiconductor devices PKG1, PKG2, and PKG3, and the coil L. As a result, it is possible to prevent the deterioration of the electronic components mounted at the wiring substrate CB1, and to stabilize the performances of the electronic device ED1. In addition, it is possible to improve the reliability of the electronic device ED1.

Then, in the electronic device ED1 of First Embodiment, the heat radiation material TM is not required to be used as with Study Example 2. For this reason, first, the manufacturing cost can be reduced. Secondly, other electronic components than the heat radiation material TM can be arranged in the region where the heat radiation material TM was arranged in Study Example 2. Thirdly, the semiconductor devices PKG1, PKG2, and PKG3 can be arranged at either of the front surface CBa side and the back surface CBb side of the wiring substrate CB1.

Incidentally, it can also be considered that, at the wiring layer WL4, the heat radiation pattern CDh1 is provided in such a manner as to overlap the electronic components such as the semiconductor device PKG1. However, the heat radiation pattern CDh1 is a conductor pattern not to be electrically coupled with the electronic components such as the semiconductor device PKG1. For this reason, a conductor pattern to be coupled with electronic components is required to be formed under the electronic components such as the semiconductor device PKG1. Therefore, when the heat radiation pattern CDh1 is provided in such a manner as to overlap the electronic component such as the semiconductor device PKG1, it becomes impossible to form a coupling conductor pattern under the electronic component. As a result, it becomes difficult to establish a connection with electronic components such as the semiconductor device PKG1. This is disadvantageous for miniaturization of the electronic device ED1. Incidentally, when the wiring substrate CB1 is incorporated with the motor 5 in the housing HS as in the electronic device ED1 of present First Embodiment, the size of the wiring substrate CB1 depends upon the size of the motor 5. For this reason, an increase in size of the wiring substrate CB1 itself is difficult.

In contrast, at the wiring substrate CB1 of the present First Embodiment, the heat radiation pattern CDh1 is formed only at the periphery of the through hole HC of the circumferential part of the wiring substrate CB1. The periphery of the through hole HC is the region where the electronic components such as the semiconductor device PKG1 are not arranged. For this reason, a coupling conductor pattern can be formed under the electronic components. As a result, without increasing the size of the wiring substrate CB1, connection with the electronic components such as the semiconductor device PKG1 can be properly performed.

Then, at the wiring substrate CB1 of the present First Embodiment, as described previously, the ground pattern CDg1 formed at the wiring layer WL3 is interposed at the heat radiation path from the semiconductor device PKG1, and the like to the heat radiation pattern CDh1. As a result, without proving the heat radiation pattern CDh1 in such a manner as to overlap the semiconductor device PKG1 at the wiring layer WL4, the heat generated at the semiconductor device PKG1 and the like can be released to the housing HS.

Alternatively, it can also be considered that, at the wiring layer WL3 and the wiring layer WL4, the ground pattern CDg1 and the heat radiation pattern CDh1 are electrically coupled with each other via a via wire, or the like. However, when the wiring substrate CB1 is fixed to the projection BS, the screw BT may cut the inner circumferential surface of the through hole HC, thereby to expose the heat radiation patterns CD1 to CD4. Further, when the wiring substrate CB1 is fixed to the projection BS, the insulation layer IL3a may be cut by a washer WS, thereby to expose the heat radiation pattern CD1. Similarly, when the wiring substrate CB1 is fixed to the projection BS, the insulation layer IL3b may be cut by the projection BS, thereby to expose the heat radiation pattern CD4. When the exposed heat radiation patterns CD1 to CD3 are in contact with the washer WS or the screw BT, the heat radiation patterns CD1 to CD3 are electrically coupled via the washer WS or the screw BT with the housing HS. The exposed heat radiation pattern CD4 is electrically coupled directly with the housing HS. Originally, the heat radiation patterns CD1 to CD4 and the heat radiation pattern CDh1 have been electrically coupled with each other. Herein, as described previously, when the ground pattern CDg1 and the heat radiation pattern CDh1 are electrically coupled with each other, an external noise may propagate from the housing HS to the ground pattern CDg1, resulting in the occurrence of a malfunction of the control type circuit.

In contrast, in the wiring substrate CB1 of the present First Embodiment, the heat radiation pattern CDh1 and the ground pattern CDg1 are not electrically coupled with each other. For this reason, when the wiring substrate CB1 is fixed to the projection BS, as described previously, even if the heat radiation patterns CD1 to CD4 are exposed, and the housing HS and the heat radiation pattern CDh1 are electrically coupled with each other, the heat radiation pattern CDh1 and the ground pattern CDg1 are not electrically coupled with each other. Therefore, it is possible to prevent the malfunction of the control type circuit resulting from the propagation of an external noise from the housing HS via the heat radiation pattern CDh1 to the ground pattern CDg1.

Further, when the ground pattern CDg1 is provided at the wiring layer WL3 in such a manner as to overlap the projection BS of the main body part 1b (i.e., the region of the housing HS where the back surface CBb of the wiring substrate CB1 and the housing HS are in contact with each other) without providing the heat radiation pattern CDh1 at the wiring layer WL3, the insulation layer IL2b and the insulation layer IL3b are present between the ground pattern CDg1 and the projection BS. For this reason, the thermal conductivity from the ground pattern CDg1 to the projection BS is low.

In contrast, at the wiring substrate CB1 of the present First Embodiment, the heat radiation pattern CDh1 is formed at the wiring layer WL4. For this reason, the insulation layer present between the heat radiation pattern CDh1 and the projection BS can be minimized (only the insulation layer IL3b), so that the efficiency of the thermal conductivity from the heat radiation pattern CDh1 to the projection BS can be enhanced.

Further, for the electronic device ED102 of Study Example 2, in order to release the heat to the housing HS, the heat radiation material TM, and the heat radiation patterns CDh102a and CDh102b and the through electrodes TEa and TEb for transmitting the heat to the heat radiation material TM were necessary. In contrast, for the electronic device ED1 of First Embodiment, in order to release the heat to the housing HS, the heat radiation pattern CDh1 and the ground pattern CDg1 are necessary. Of these, the ground pattern CDg1 is a ground pattern for electronic components mounted at the wiring substrate CB1, and hence is not required to be formed additionally. For this reason, with the electronic device ED1 of First Embodiment, the manufacturing cost can be reduced as compared with the electronic device ED102 of Study Example 2.

Further, the ground pattern CDg1 is, as described previously, formed over the entire main surface of the wiring substrate CB1 in order to reduce the impedance. Namely, all the regions where the semiconductor devices PKG1, PKG2, and PKG3, and the coil L are arranged overlap the ground pattern CDg1 along the thickness direction of the wiring substrate CB1. For this reason, it is possible to sufficiently ensure the heat radiation path from the semiconductor devices PKG1, PKG2, and PKG3, and the coil L to the ground pattern CDg1. As a result, the heat generated from the semiconductor devices PKG1, PKG2, and PKG3, and the coil L can be transmitted to the ground pattern CDg1 with efficiency.

Further, the ground pattern CDg1 is formed over the entire main surface of the wiring substrate CB1. For this reason, the heat generated from the electronic components other than the semiconductor devices PKG1, PKG2, and PKG3, and the coil L arranged on the back surface CBb side of the wiring substrate CB1 is also transmitted to the ground pattern CDg1. Namely, for the electronic device ED1 of First Embodiment, the heat generated from the electronic components other than the semiconductor devices PKG1, PKG2, and PKG3, and the coil L can also be released with efficiency.

Incidentally, for the wiring substrate CB1 of the present First Embodiment, a description has been given by taking as an example the case where the shapes of the heat radiation patterns CD1, CD2, CD3, and CD4, and the heat radiation pattern CDh1 are each formed in a ring shape surrounding the through hole HC. However, the present invention is not limited thereto. However, the heat radiation pattern CD4 and the heat radiation pattern CDh1 overlap the projection BS of the main body part 1*b* (i.e., the region where the back surface CBb of the wiring substrate CB1 and the housing HS are in contact with each other) around the through hole HC into which the screw BT is inserted. For this reason, when each area of the heat radiation pattern CD4 and the heat radiation pattern CDh1 is set at a given area, the heat radiation efficiency becomes maximum in the case where the heat radiation pattern CD4 and the heat radiation pattern CDh1 are each in a ring shape centering around the through hole HC. For this reason, the heat radiation pattern CD4 and the heat radiation pattern CDh1 are preferably formed in a ring shape surrounding the through hole HC. The heat radiation patterns CD1, CD2, and CD3 overlapping the heat radiation pattern CD4 are also similarly preferably formed in a ring shape surrounding the through hole HC.

Further, for the wiring substrate CB1 of the present First Embodiment, as the conductive film overlapping the semiconductor devices PKG1, PKG2, and PKG3, and the coil L, and the heat radiation pattern CDh1, the ground pattern CDg1 formed at the wiring layer WL3 was adopted. However, the present invention is not limited thereto. As described previously, for the wiring substrate CB1 of the present First Embodiment, a description has been given by taking as an example the case where the wiring layer WL2 is a power supply plane, and the wiring layer WL3 is a ground plane. However, for example, when a power supply pattern is formed at the wiring layer WL3, as the conductive film overlapping the semiconductor devices PKG1, PKG2, and PKG3, and the coil L, and the heat radiation pattern CDh1, the power supply pattern formed at the wiring layer WL3 can be adopted.

Further, for the wiring substrate CB1 of the present First Embodiment, a description has been given by taking as an example the case where the heat radiation pattern CDh1 is formed at the wiring layer WL4. However, the present invention is not limited thereto. The heat radiation pattern CDh1 may also be formed at the wiring layer WL1 or the wiring layer WL2. However, from the viewpoint of enhancing the heat radiation efficiency, the heat radiation pattern CDh1 is preferably formed at the wiring layer WL4 closest to the wiring layer WL3 including the ground pattern CDg1 formed thereover, and closest to the projection BS of the main body part 1*b* (i.e., the region where the back surface CBb of the wiring substrate CB1 and the housing HS are in contact with each other). Particularly, the heat radiation pattern CDh1 is formed at the wiring layer WL4. This case is also advantageous in that the insulation layer (core layer) IL1 thicker, and having a lower thermal conductivity than the insulation layer (prepreg layer) IL2*b* is not included at the heat radiation path from the ground pattern CDg1 via the heat radiation pattern CDh1 to the housing HS.

Further, as described previously, for the electronic device ED1 of the present First Embodiment, the semiconductor devices PKG1, PKG2, and PKG3 can be arranged on either of the front surface CBa side and the back surface CBb side of the wiring substrate CB1. However, when the heat radiation pattern CDh1 is formed at the wiring layer WL4, and the ground pattern CDg1 is formed at the wiring layer WL3, the semiconductor devices PKG1, PKG2, and PKG3 are preferably arranged on the back surface CBb side of the wiring substrate CB1 so as to minimize the heat radiation path from the semiconductor device PKG1, and the like to the housing HS. Particularly, the semiconductor devices PKG1, PKG2, and PKG3 are arranged on the back surface CBb side of the wiring substrate CB1. This case is also advantageous in that the insulation layer (core layer) IL1 thicker, and having a lower thermal conductivity than the insulation layer (prepreg layer) IL2*b* is not included at the heat radiation path from the semiconductor device PKG1, and the like to the ground pattern CDg1.

Further, the heat generated from the electronic components mounted on the front surface CBa side of the wiring substrate CB1, and the heat transmitted from the ground pattern CDg1 to the front surface CBa side of the wiring substrate CB1 are also desirably released with efficiency. For this reason, in addition to the heat radiation pattern CDh1 formed at the wiring layer WL4, a heat radiation pattern is preferably formed at the wiring layer WL1 or the wiring layer WL2. The heat radiation patterns are more preferably formed at both of the wiring layers WL1 and WL2. With this configuration, the heat generated from the electronic components mounted on the front surface CBa side of the wiring substrate CB1, and the heat transmitted from the ground pattern CDg1 to the front surface CBa side of the wiring substrate CB1 can be released from the heat radiation patterns formed at the wiring layers WL1 and WL2 via the heat radiation patterns CD1, and CD2 and the through electrode TE to the projection BS of the main body part 1*b* (housing HS).

Then, a description will be given to other features of the electronic device ED1 of the present First Embodiment.

As shown in FIG. 11, for the wiring substrate CB1 of First Embodiment, the heat radiation pattern CD1 is formed at the wiring layer WL1; the heat radiation pattern CD2, at the wiring layer WL2; the heat radiation pattern CD3, at the wiring layer WL3; and the heat radiation pattern CD4, at the wiring layer WL4. The heat radiation patterns CD1, CD2, CD3, and CD4 are each formed in a ring shape along the outer circumference of the through hole HC formed at the circumferential part of the wiring substrate CB1 (in such a manner as to surround the through hole HC). Namely, the heat radiation patterns CD1, CD2, CD3, and CD4 are arranged in proximity to the periphery of the screw BT inserted into the through hole HC. Further, the heat radiation patterns CD1, CD2, CD3, and CD4 overlap one another in the thickness direction of the wiring substrate CB1. Still further, a plurality of through holes TH and through electrodes TE are formed along the outer circumference of the through hole HC formed at the circumferential part of the wiring substrate CB1 (in such a manner as to surround the through hole HC). The through holes TH and the through electrodes TE penetrate through respective parts of the heat radiation patterns CD1, CD2, CD3, and CD4, and are electrically coupled with the heat radiation patterns CD1, CD2, CD3, and CD4.

As shown in FIG. 11, for the electronic device ED1 of the present First Embodiment, the heat generated from the semiconductor device PKG1 is transmitted to the ground pattern CDg1 as described previously. Herein, the heat transmitted to the ground pattern CDg1 may also be transmitted to the insulation layer IL1 in contact with the ground pattern CDg1, and the insulation layer IL2*a* or the insulation layer IL3*a* at a layer higher than the insulation layer IL1. Further, the heat generated from the elements such as the MCU 7, the predriver 8, the regulator 9, and the zero Ω resistor 11 arranged on the front surface CBa side of the wiring substrate CB1 shown in FIG. 12 may be transmitted to the insulation films IL3a, IL2a, IL', and the like.

Herein, for the wiring substrate CB1 of the present First Embodiment, the heat radiation patterns CD1, CD2, CD3, and CD4 are formed at the wiring layers WL1, WL2, WL3, and WL4, respectively. For this reason, the heat transmitted to respective insulation layers IL', IL2a, and IL3a is transmitted to the heat radiation patterns CD1, CD2, CD3, and CD4. Then, the heat is transmitted to the through respective electrode TE penetrating through parts of the heat radiation patterns CD1, CD2, CD3, and CD4. Herein, the heat radiation patterns CD1, CD2, CD3, and CD4 overlap the projection BS of the main body part 1b in the thickness direction of the wiring substrate CB1. Particularly, the heat radiation pattern CD4 is closest to the projection BS. For this reason, the heat transmitted to the through electrode TE is transmitted from the heat radiation pattern CD4 to the projection BS. The heat transmitted to the projection BS diffuses to the entire housing HS including the main body part 1b.

Further, the heat radiation patterns CD1, CD2, CD3, and CD4, and the through electrode TE are arranged in proximity to the periphery of the screw BT inserted into the through hole HC. For this reason, the heat transmitted to the heat radiation patterns CD1, CD2, CD3, and CD4, and the through electrode TE is transmitted via the insulation layers IL1, IL2a, IL2b, IL3a, and IL3b to the screw BT. The heat transmitted to the screw BT diffuses to the entire housing HS including the main body part 1b.

From the description up to this point, the wiring substrate CB1 of the present First Embodiment has the heat radiation patterns CD1, CD2, CD3, and CD4, and the through electrode TE. For this reason, the heat generated from the electronic components mounted at the wiring substrate CB1 in addition to the heat radiation path via the ground pattern CDg1 and the heat radiation pattern CDh1 can be released to the housing HS with efficiency, thereby to reduce the temperatures of the electronic components. As a result, it is possible to prevent the deterioration of the electronic components, and to further stabilize the performances of the electronic device ED1. In addition, the reliability of the electronic device ED1 can be further improved.

Incidentally, a description has been given by taking as an example the case where at the wiring substrate CB1 of the present First Embodiment, the heat radiation patterns CD1, CD2, CD3, and CD4, and the through electrode TE are formed. However, the present invention is not limited thereto. For example, the heat radiation patterns CD1, CD2, CD3, and CD4 and the through electrode TE can also be omitted if not required in manufacturing. However, as described previously, when the heat radiation patterns CD1, CD2, CD3, and CD4, and the through electrode TE are formed in such a manner as to surround the through hole HC into which the screw BT is arranged, the heat radiation path by the heat radiation pattern CD1, and the like is formed. For this reason, the formation of the heat radiation pattern CD1, and the like at the wiring substrate CB1 can enhance the heat radiation efficiency as compared with the case where the heat radiation pattern CD1, and the like are not formed.

<Experimental Results>

Herein, in order to check the heat radiation effects of the electronic device ED101 of Study Example 1, the electronic device ED102 of Study Example 2, and the electronic device ED1 of First Embodiment, the end-point temperature of representative electronic component mounted at each wiring substrate was calculated by simulation.

Figure 19:
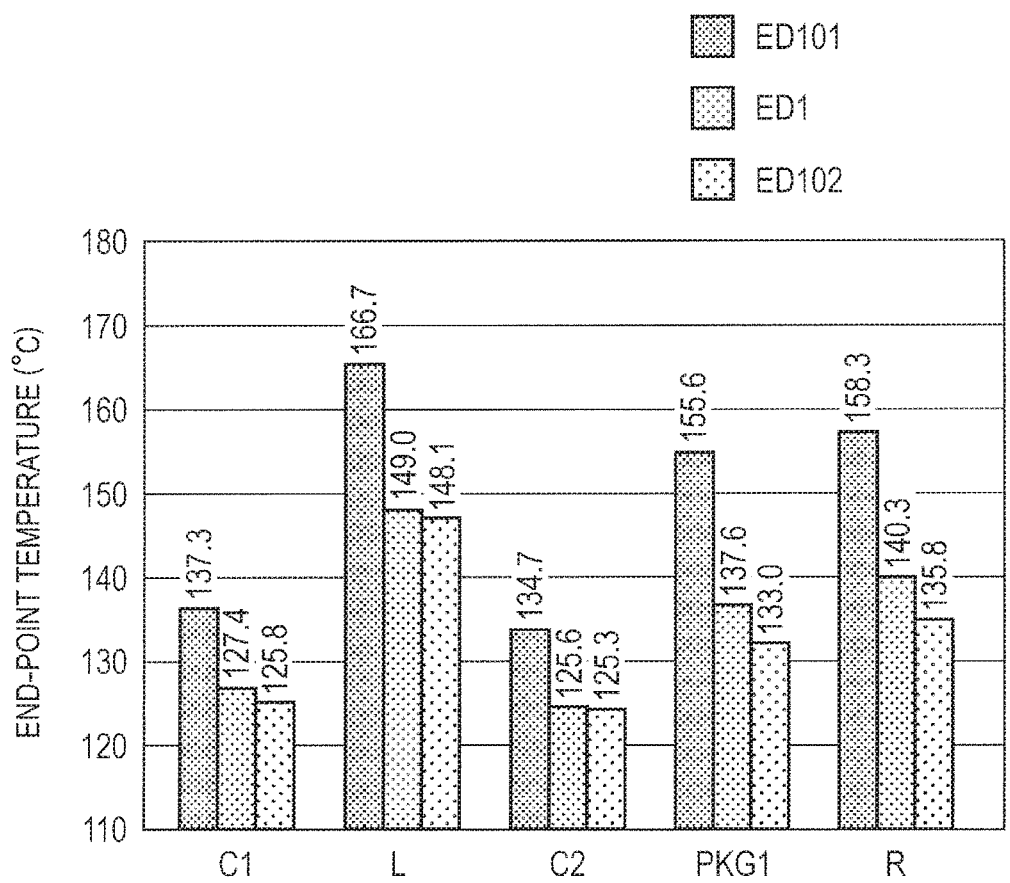
FIG. 19 is a graph showing the end-point temperature with the temperature rise saturated in continuous operation of a capacitor, a coil, a capacitor, a semiconductor device, and a resistance coupled to the semiconductor device mounted in each electronic device of Study Example 1, Study Example 2, and First Embodiment.

FIG. 19 is a graph showing the end-point temperature with the temperature rise saturated in continuous operation of the capacitor C1, the coil L, the capacitor C2, the semiconductor device PKG1, and the resistance R coupled to the semiconductor device PKG1 mounted in each electronic device of Study Example 1, Study Example 2, and First Embodiment. Incidentally, the resistance R shown in FIG. 19 is the resistance coupled between the source of the power MOSFET 15b and ground shown in FIG. 8. The voltage to be applied to the resistance R is detected by the predriver 8 of the control type circuit configuration part 17, and the voltage to be supplied to the motor 5 is controlled.

As shown in FIG. 19, for the electronic device ED101 of Study Example 1, with the temperature rise saturated in the continuous operation, the temperatures of the capacitor C1, the coil L, the capacitor C2, the semiconductor device PKG1, and the resistance R were 137.3° C., 166.7° C., 134.7° C., 155.6° C., and 158.3° C., respectively. For the electronic device ED101 of Study Example 1, as described previously, a low heat radiation efficiency appears as the result.

In contrast, as shown in FIG. 19, for the electronic device ED102 of Study Example 2, with the temperature rise saturated in continuous operation, the temperatures of the capacitor C1, the coil L, the capacitor C2, the semiconductor device PKG1, and the resistance R were 125.8° C., 148.1° C., 125.3° C., 133.0° C., and 135.8° C., respectively. For the electronic device ED102 of Study Example 2, the end-point temperature of any electronic component was reduced as compared with the electronic device ED102 of Study Example 1. This can indicate that a sufficient heat radiation effect can be provided.

Then, as shown in FIG. 19, for the electronic device ED1 of the present First Embodiment with the temperature rise saturated in continuous operation, the temperatures of the capacitor C1, the coil L, the capacitor C2, the semiconductor device PKG1, and the resistance R were 127.4° C., 149.0° C., 125.6° C., 137.6° C., and 140.3° C., respectively. Thus, for the electronic device ED1 of First Embodiment, it has been shown that the same heat radiation effect as that of the electronic device ED102 of Study Example 2 can be provided even without using the heat radiation material TM.

Incidentally, although not shown, for the electronic device ED1 of First Embodiment, simulation is performed by changing the area of the overlap part OVP1a (the overlapping region of the ground pattern CDg1 and the heat radiation pattern CDh1). This has resulted in that when the area of the overlap part OVP1a shown in FIG. 19 is set at 30 mm$^2$ per heat radiation pattern CDh1 at one site of the heat radiation patterns CDh1 at four sites, the same heat radiation effect as that of the electronic device ED102 of Study Example 2 can be provided. This result has indicated that the area of the overlap part OVP1a is desirably 30 mm$^2$ or more. Conversely, when the heat radiation pattern CDh1 is increased in size, and the area of the overlap part OVP1a is set at more than 30 mm$^2$, the end-point temperature of each electronic component further decreases. Such an embodiment as to increase the area of the overlap part OVP1a will be described in details in the following Second Embodiment.

Second Embodiment

Figure 20:
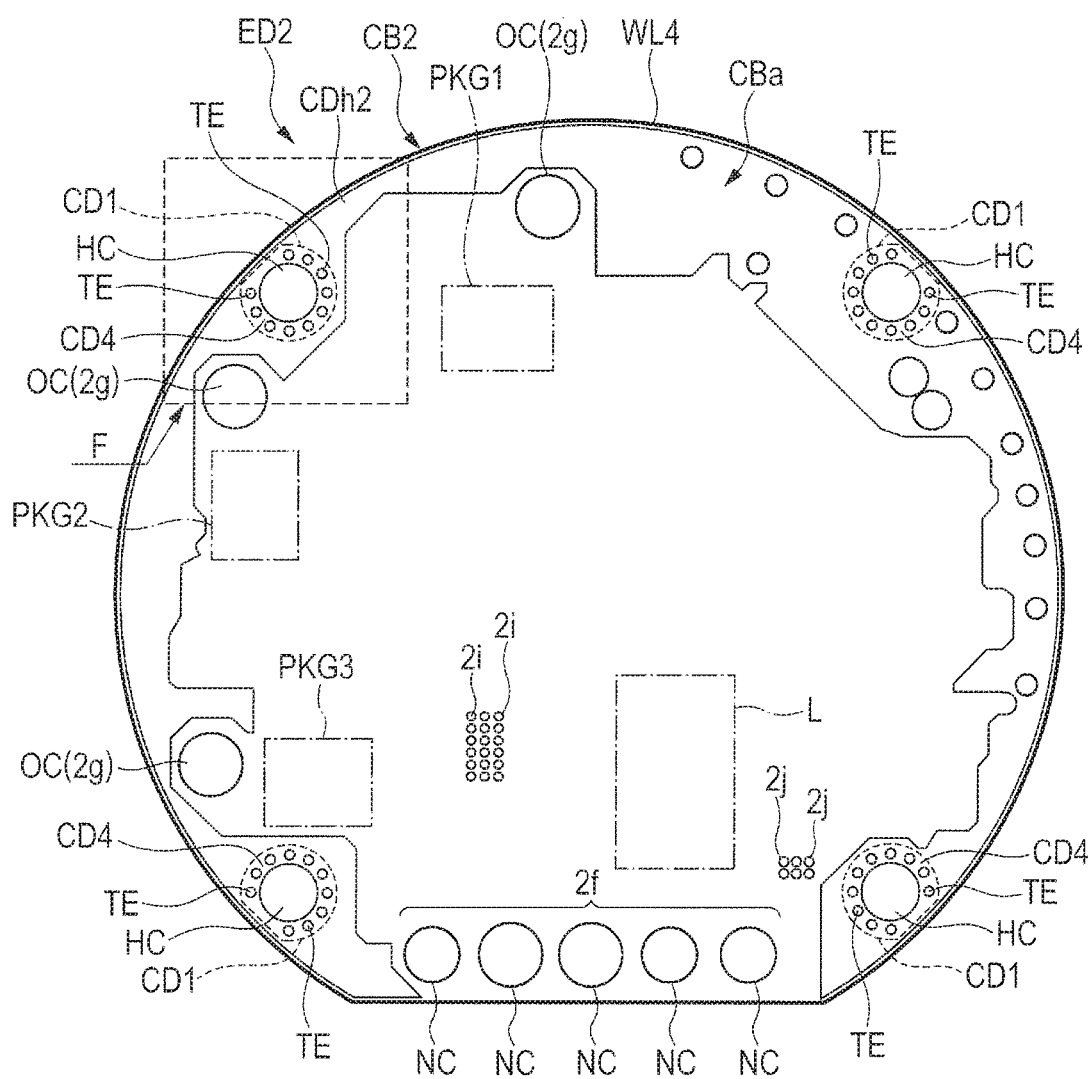
FIG. 20 is a plan view showing a structure of a fourth wiring layer of a wiring substrate of Second Embodiment.
Figure 21:
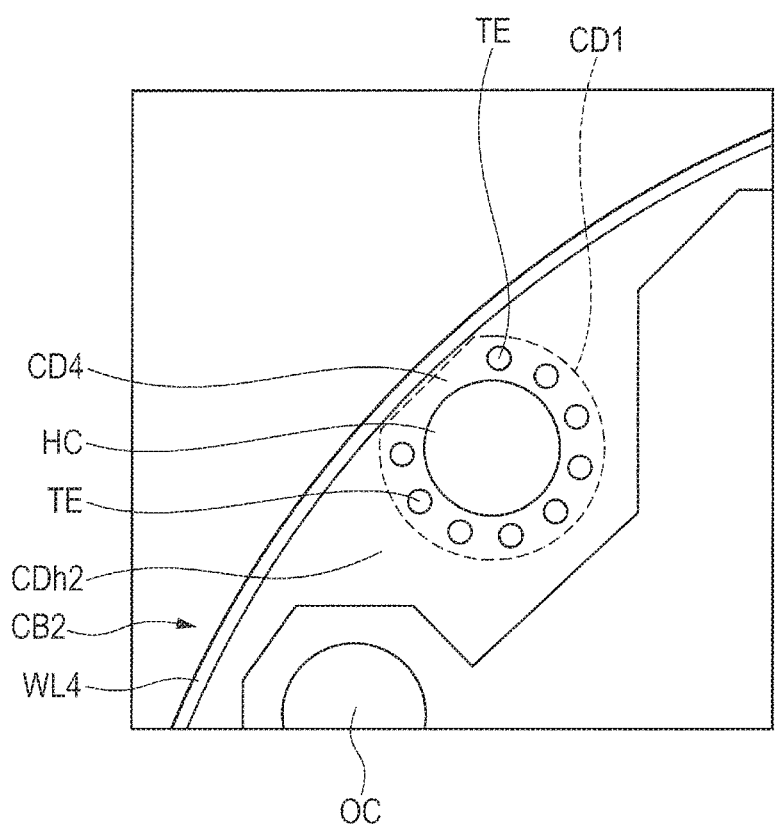
FIG. 21 is a partially enlarged plan view showing a structure of a part F in FIG. 20 on an enlarged scale.
Figure 22:
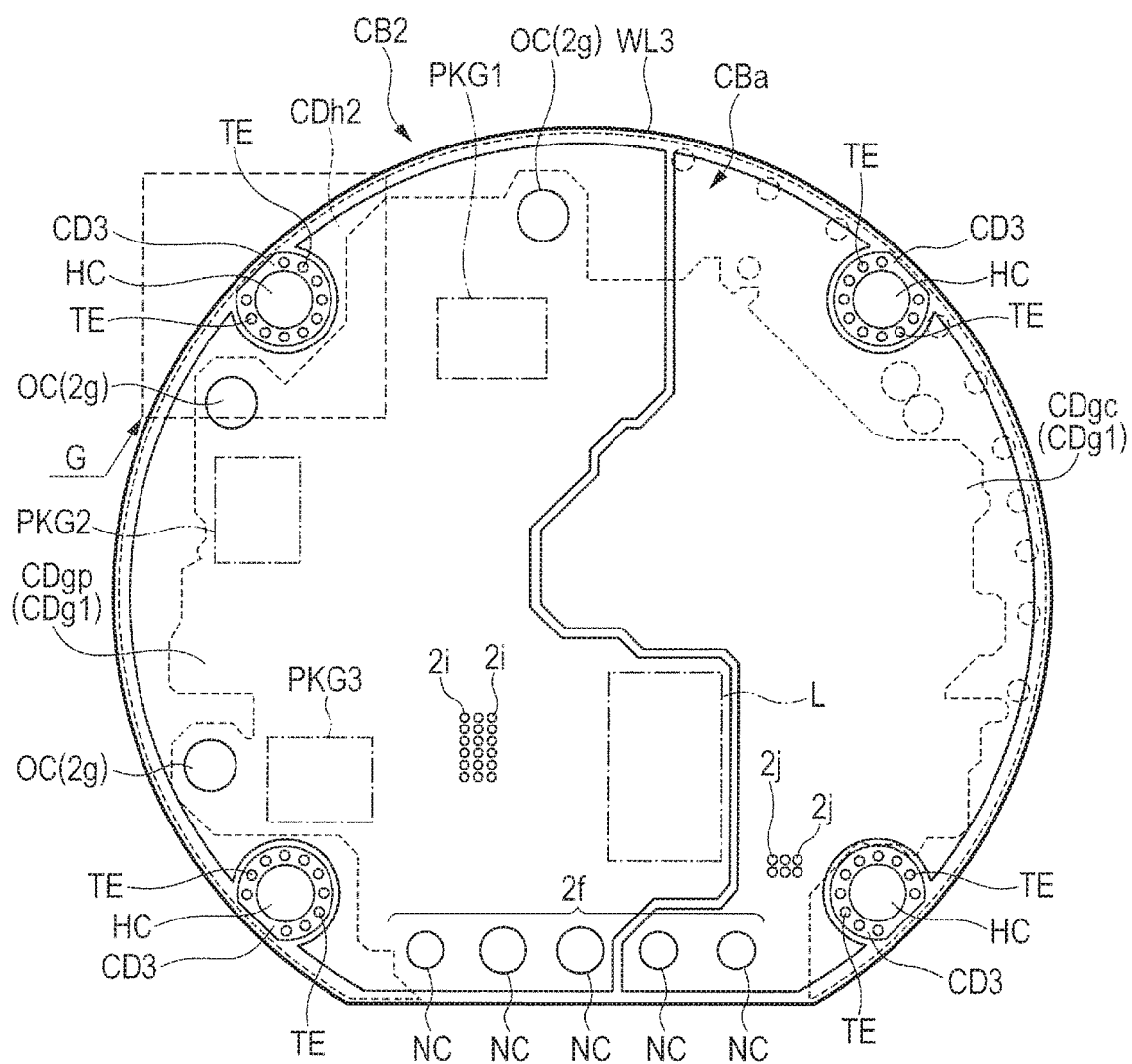
FIG. 22 is a plan view showing a structure of a third wiring layer of a wiring substrate of Second Embodiment.
Figure 23:
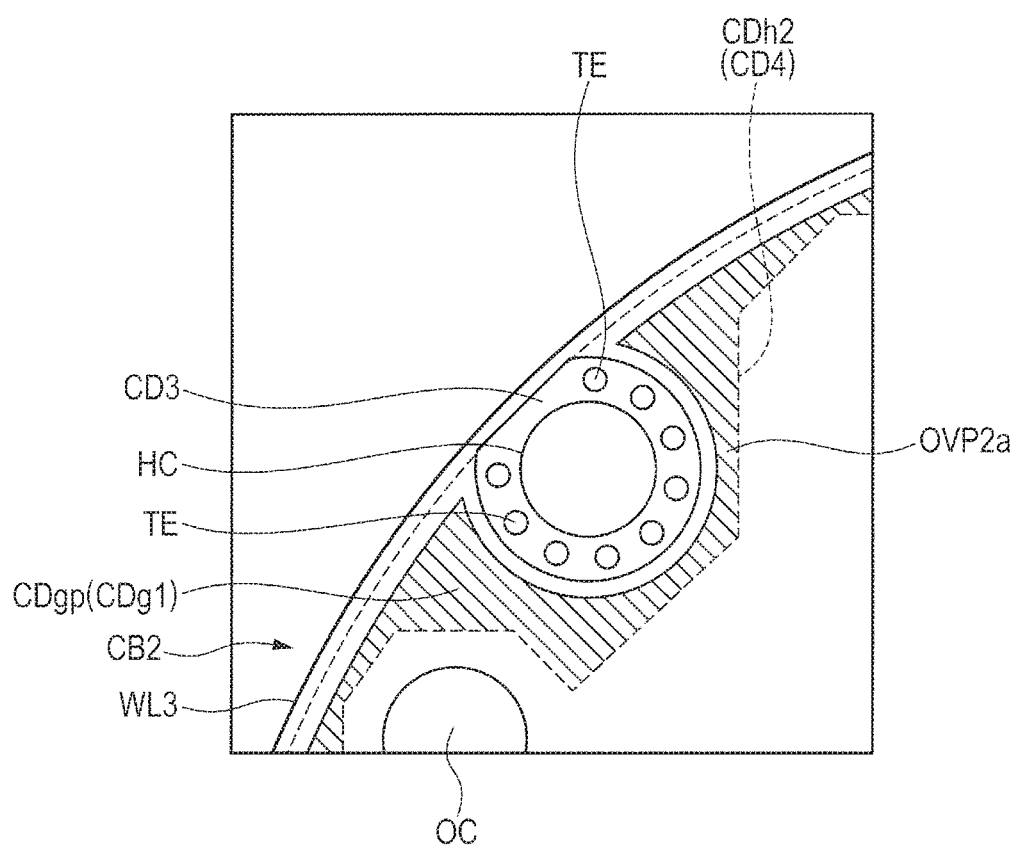
FIG. 23 is a partially enlarged plan view showing a structure of a part G in FIG. 22 on an enlarged scale.

Then, an electronic device of Second Embodiment will be described. FIG. 20 is a plan view showing a structure of a fourth wiring layer of a wiring substrate of the electronic device of Second Embodiment; FIG. 21 is a partially enlarged plan view showing a structure of a part F in FIG. 20; FIG. 22 is a plan view showing a structure of a third wiring layer of a wiring substrate of the electronic device of Second embodiment; and FIG. 23 is a partially enlarged plan view showing a structure of a part G in FIG. 22 on an enlarged scale.

Although not shown, the electronic device ED2 of Second Embodiment has a wiring substrate CB2 in which electronic components are mounted at a wiring substrate (substrate). Other configurations than that of the wiring substrate CB2 are the same as those of the electronic device ED1 of First Embodiment. For this reason, the circuit configuration of the electronic device ED2 of Second Embodiment is the same as the circuit configuration of the electronic device ED1 of First Embodiment shown in FIG. 8. The difference between the wiring substrate CB2 of Second Embodiment and the wiring substrate CB1 of First Embodiment is in that the wiring substrate CB2 has a heat radiation pattern (a conductor pattern or a conductive film) CDh2 having a different shape from that of the heat radiation pattern CDh1 of First Embodiment.

FIGS. 20 and 21 are each a plan view of the wiring layer WL4 of the wiring substrate CB2 as seen from the front surface CBa side. FIGS. 22 and 23 are each a plan view of the wiring layer WL3 of the wiring substrate CB2 as seen from the front surface CBa side.

As shown in FIGS. 20 and 21, at the wiring layer WL4 of the wiring substrate CB2 of Second Embodiment, a heat radiation pattern CDh2 extending along the outer circumference of the wiring substrate CB2 is formed. As shown in FIG. 20, the heat radiation pattern CDh2 is formed as one coupled conductor pattern. For this reason, as shown in FIGS. 22 and 23, the overlap part OVP2a of the ground pattern CDg1 and the heat radiation pattern CDh2 extends along the outer circumference of the wiring substrate CB2.

As described in the section of the experimental results, the larger the area of the heat radiation pattern CDh2 is, the larger the area of the overlap part OVP2a of the heat radiation pattern CDh2 and the ground pattern CDg1. Thus, the heat transmitted from the semiconductor device PKG1 to the ground pattern CDg1 is transmitted to the heat radiation pattern CDh2 with efficiency. For this reason, the larger the area of the heat radiation pattern CDh2 is, the higher the heat radiation efficiency is. On the other hand, as described previously, the wiring layer WL4 is a wiring region for elements such as the semiconductor device PKG1. For this reason, when the area of the heat radiation pattern CDh2 is excessively increased, it becomes impossible to sufficiently ensure the wiring region for elements such as the semiconductor device PKG1.

For this reason, from the viewpoint of making compatible the heat radiation efficiency and ensuring of the wiring region, for the electronic device ED2 of Second Embodiment, the heat radiation pattern CDh2 is formed in the region surrounded by the outer circumference of the wiring substrate CB2 and the outer circumference of the wiring region, of the region where the wires for elements such as the semiconductor device PKG1 are not formed. The area of the heat radiation pattern CDh2 thus formed is 589 mm$^2$, and the area of the overlap part OVP2a is 524 mm$^2$. Therefore, the electronic device ED2 of Second Embodiment can provide a higher heat radiation effect than that of the electronic device ED1 (the area of the overlap part OVP1a is 30 mm$^2$) of First Embodiment.

Further, the heat radiation pattern CDh2 of Second Embodiment is formed as one coupled conductor pattern. Particularly, the peripheries of the through holes HC (the regions overlapping the projections BS of the main body part 1b) at four sites formed at the wiring substrate CB2 are electrically coupled by the heat radiation pattern CDh2. For this reason, the heat transmitted from the semiconductor device PKG1, and the like via the ground pattern CDg1 to the heat radiation pattern CDh2 is uniformly transmitted from the periphery of each through hole HC to the projection BS (housing HS). As a result, the electronic device ED2 of Second Embodiment can provide a higher heat radiation effect than that of the electronic device ED1 of First Embodiment.

From the description up to this point, when an importance is placed on the heat radiation efficiency, the configuration of the wiring substrate CB2 of Second Embodiment is preferably adopted. On the other hand, when the wiring region is still more ensured than that of the wiring substrate CB2 shown in FIG. 20, and an importance is placed on the mounting efficiency of the semiconductor device and other electronic components, the configuration of the wiring substrate CB1 of First Embodiment is preferably adopted. Namely, as shown in FIG. 13, preferably, the heat radiation pattern CDh1 is formed only at the periphery of the through hole HC of the circumferential part of the wiring substrate CB1, so that a sufficient heat radiation effect can be exerted while reducing the area of the heat radiation pattern CDh1.

Third Embodiment

Figure 24:
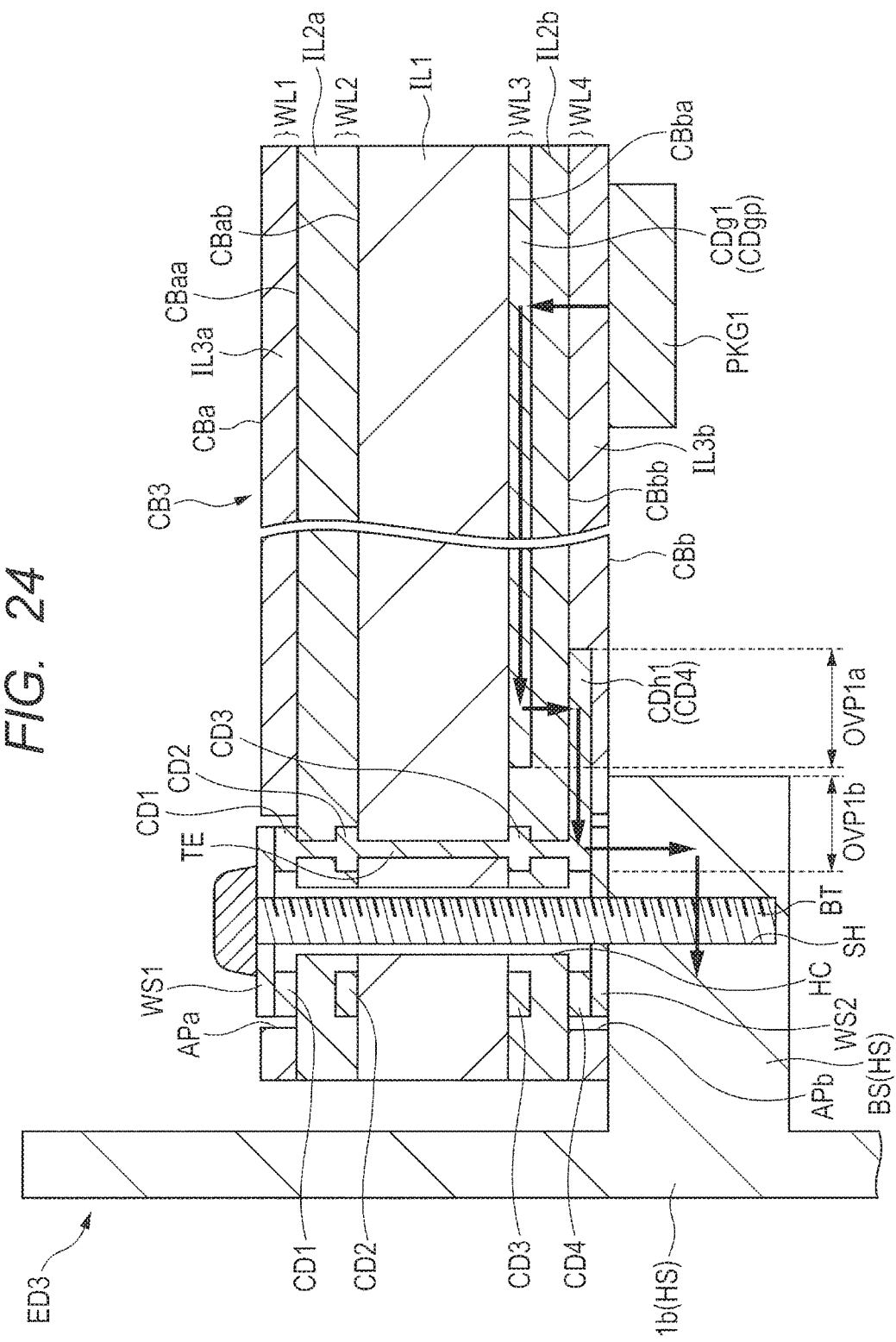
FIG. 24 is a partially enlarged cross sectional view showing a fixed structure of a wiring substrate of Third Embodiment.

Then, an electronic device of Third Embodiment will be described. FIG. 24 is a partially enlarged cross sectional view showing a fixed structure of a wiring structure in the electronic device of Third Embodiment.

Although not shown, the electronic device ED3 of Third Embodiment has a wiring substrate CB3 in which electronic components are mounted at a wiring substrate (substrate). Other configurations than that of the wiring substrate CB3 are the same as those of the electronic device ED1 of First Embodiment. For this reason, the circuit configuration of the electronic device ED3 of Third Embodiment is the same as the circuit configuration of the electronic device ED1 of First Embodiment shown in FIG. 8. The difference between the wiring substrate CB3 of Third Embodiment and the wiring substrate CB1 of First Embodiment is in that at the periphery of the through hole HC, openings APa and APb are formed at parts of the insulation layers IL3a and IL3b, thereby to expose the heat radiation patterns CD1 and CD4 and the heat radiation pattern CDh1. As shown in FIG. 24, the wiring substrate CB3 is fixed to the projection BS (i.e., the housing HS) by screwing the screw BT inserted via a washer (sheet conductive member) WS1 into the through hole HC further into a screw hole SH formed at the projection BS of the main body part 1b via a washer (sheet conductive member) WS2. The washers WS1 and WS2 are each made of a metal.

For this reason, the heat radiation pattern CD1 and the washer WS1 are in contact with each other, and the heat radiation pattern CD4 and the heat radiation pattern CDh1 and the washer WS2 are in contact with each other. The washer WS1 is in contact with the screw BT. The screw BT is electrically coupled with the housing HS via the projection BS. Further, as described previously, the heat radiation patterns CD1, CD2, CD3, and CD4 are electrically coupled via the through electrode TE. Further, the heat radiation pattern CD4 and the heat radiation pattern CDh1 are integrally formed. As a result, for the electronic device ED3 of Third Embodiment, the heat radiation pattern CDh1 and the projection BS of the main body part 1b (housing HS) are electrically coupled with each other via the heat radiation pattern CD4 and the washer WS2. Further, the heat radiation pattern CDh1 and the projection BS of the main body part 1b (housing HS) are electrically coupled with each other via the heat radiation pattern CD4, the through electrode TE, the heat radiation pattern CD1, the washer WS1, and the screw BT.

As shown in FIG. 24, for the electronic device ED3 of Third Embodiment, the steps until the heat generated from the semiconductor device PKG1 is transmitted via the ground pattern CDg1 to the heat radiation pattern CDh1 and the heat radiation pattern CD4 are the same as those for the electronic device ED1 of First Embodiment. Herein, for the electronic device ED3 of Third Embodiment, the heat radiation pattern CDh1 and the heat radiation pattern CD4 are electrically coupled with the projection BS via the washer WS2. For this reason, the heat transmitted to the heat radiation pattern CDh1 and the heat radiation pattern CD4 is transmitted to the projection BS via the washer WS2. The heat transmitted to the projection BS of the main body part 1b diffuses to the entire housing HS including the main body part 1b. The heat radiation path up to this point is indicated with arrows in FIG. 24.

Further, as with First Embodiment and Second Embodiment, for the electronic device ED3 of Third Embodiment, other electronic components including the semiconductor devices PKG2 and PKG3, and the coil L also overlap the ground pattern CDg1 in the thickness direction of the wiring substrate CB3 (plan view). For this reason, the heat generated from the semiconductor devices PKG2 and PKG3, the coil L, and the like also diffuses to the entire housing HS via the ground pattern CDg1, the heat radiation pattern CDh1, the heat radiation pattern CD4, the washer WS2, and the projection BS as described above.

From the description up to this point, for the electronic device ED3 of Third Embodiment, as shown in FIG. 24, the heat radiation pattern CDh1 is electrically coupled with the projection BS via the washer WS2. For this reason, the heat transmitted to the heat radiation pattern CDh1 is transmitted to the projection BS via the washer WS2 of a conductor. Accordingly, with the electronic device ED3 of Third Embodiment, as compared with the electronic device ED1 of First Embodiment in which the insulation layer IL3b is present between the heat radiation pattern CDh1 and the projection BS, the heat generated from the semiconductor devices PKG1, PKG2, and PKG3, the coil L, and the like can be released to the housing HS with more efficiency.

Further, for the electronic device ED3 of Third Embodiment, as shown in FIG. 24, the heat radiation patterns CD1, CD2, CD3, and CD4 and the through electrode TE are electrically coupled with the screw BT via the washer WS1. For this reason, the heat transmitted to the heat radiation patterns CD1, CD2, CD3, and CD4, and the through electrode TE is transmitted to the screw BT via the washer WS1 of a conductor. The heat transmitted to the screw BT diffuses to the entire housing HS including the main body part 1b.

From the description up to this point, for the electronic device ED3 of Third Embodiment, the heat generated from the semiconductor devices PKG1, PKG2, and PKG3, the coil L, and the like can be released to the housing HS with more efficiency as compared with the electronic device ED1 of First Embodiment in which respective insulation layers IL1, IL2a, IL2b, IL3a, and IL3b are present between the heat radiation patterns CD1, CD2, CD3, and CD4 and the through electrode TE and the screw BT, respectively.

However, for the electronic device ED3 of Third Embodiment, the housing HS and the heat radiation pattern CDh1 are electrically coupled with each other. For this reason, an external noise may propagate from the housing HS to the heat radiation pattern CDh1. For the electronic device ED3 of Third Embodiment, as with the electronic device ED1 of First Embodiment, the heat radiation pattern CDh1 and the ground pattern CDg1 are not electrically coupled with each other. For this reason, an external noise less possibly propagates directly from the heat radiation pattern CDh1 to the ground pattern CDg1. However, the heat radiation pattern CDh1 and the ground pattern CDg1 overlap each other in the thickness direction of the wiring substrate CB3. For this reason, the control type circuit coupled with the ground pattern CDg1 may be adversely affected by an external noise.

On the other hand, for the electronic device ED1 of First Embodiment, the heat radiation pattern CDh1, the heat radiation patterns CD1, CD2, CD3, and CD4, and the through electrode TE are not electrically coupled with the housing HS and the screw BT. For this reason, an external noise less possibly propagates from the housing HS to the heat radiation pattern CDh1. Accordingly, an external noise much less possibly propagates from the housing HS via the heat radiation pattern CDh1 to the ground pattern CDg1. This can prevent the control type circuit coupled with the ground pattern CDg1 from being adversely affected by an external noise.

From the description up to this point, when an importance is placed on the nose resistance, the configuration of the electronic device ED1 of First Embodiment is preferably adopted. On the other hand, when an importance is placed on the heat radiation efficiency, as described previously, the electronic device ED3 of Third Embodiment is preferably adopted.

Incidentally, for the wiring substrate CB3 of the present Third Embodiment, a description has been given by taking as an example the case where around the through hole HC, openings APa and APb are formed at respective parts of the insulation layers IL3a and IL3b, respectively, thereby to expose the heat radiation patterns CD1 and CD4, and the heat radiation pattern CDh1. However, the present invention is not limited thereto. The heat radiation patterns CD1, CD2, CD3, and CD4 and the heat radiation pattern CDh1 are electrically coupled by the through electrode TE. For this reason, when any one of the heat radiation pattern CD1 or the heat radiation pattern CD4 (heat radiation pattern CDh1) is exposed, the heat transmitted to the heat radiation pattern CDh1 is transmitted via the washer WS2 or the washer WS1 and screw BT to the projection BS (housing HS). Therefore, the opening formed around the through hole HC may be only any one of the openings APa and APb.

However, the heat radiation patterns CD4 and CDh1 close to the projection BS are exposed, and the heat radiation path from the heat radiation patterns CD4 and CDh1 via the washer WS2 to the housing HS is formed. This configuration provides a higher heat radiation efficiency than the configuration in which the heat radiation pattern CD1 distant from the projection BS is exposed, and the heat radiation path from the heat radiation pattern CD1 through the through electrode TE to the housing HS via the washer WS1 and the screw BT is formed. For this reason, from the viewpoint of enhancing the heat radiation efficiency, preferably, at least the opening APb is formed, and the heat radiation pattern CD4 and the heat radiation pattern CDh1 are exposed.

Further, when both of the openings APa and APb are formed, and both of the heat radiation pattern CD1, and the heat radiation pattern CD4 and the heat radiation pattern CDh1 are exposed, in addition to the heat radiation path from the heat radiation pattern CD4 and the heat radiation pattern CDh1 via the washer WS2 to the housing HS, the heat radiation path to the housing HS through the through electrode TE from the heat radiation pattern CD1 via the washer WS1 and the screw BT is formed. For this reason, from the viewpoint of enhancing the heat radiation efficiency, more preferably, both of the openings APa and APb are formed, and both of the heat radiation pattern CD1, and the heat radiation pattern CD4 and the heat radiation pattern CDh1 are exposed.

Further, for the wiring substrate CB3 of the present Third Embodiment, a description has been given by taking as an example the case where the heat radiation patterns CD1, CD2, CD3, and CD4 and the through electrode TE are formed. However, the present invention is not limited thereto. For example, the heat radiation patterns CD1, CD2, CD3, and CD4, and the through electrode TE can be omitted if not required in manufacturing. However, as described previously, when the heat radiation patterns CD1, CD2, CD3, and CD4 and the through electrode TE are formed at the wiring substrate CB3, a heat radiation path by the heat radiation pattern CD1, and the like is formed. For this reason, the formation of the heat radiation pattern CD1, and the like at the wiring substrate CB3 can enhance the heat radiation efficiency as compared with the case where the heat radiation pattern CD1, and the like are not formed.

Particularly, for the wiring substrate CB3 of Third Embodiment, as described previously, the heat radiation path through the through electrode TE from the heat radiation pattern CD1 via the washer WS1 and the screw BT to the housing HS is formed. For this reason, from the viewpoint of enhancing the heat radiation efficiency, preferably, at least the heat radiation patterns CD1 and CD4, and the through electrode TE are formed.

Fourth Embodiment

Figure 25:
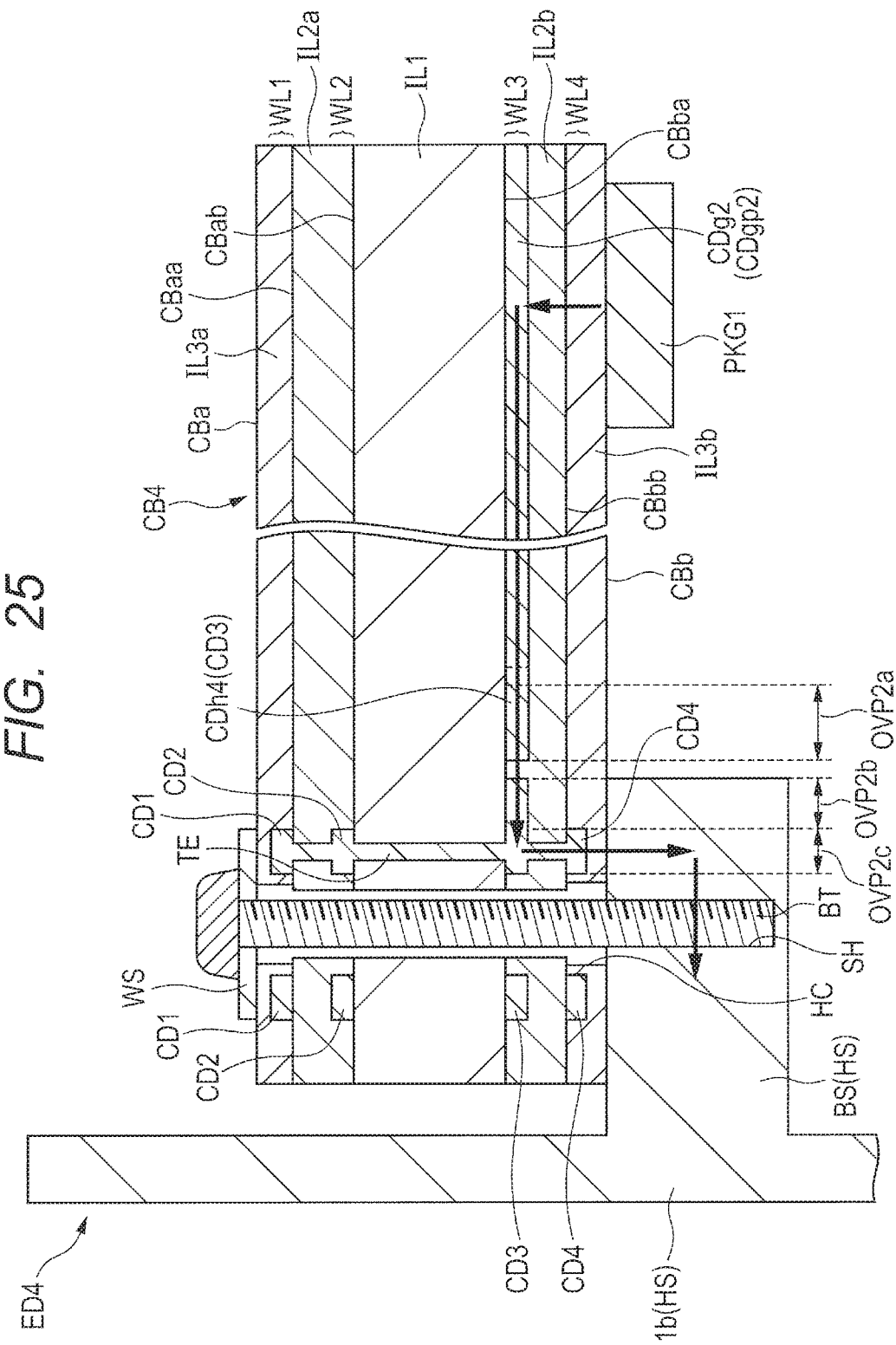
FIG. 25 is a partially enlarged cross sectional view showing a fixed structure of a wiring substrate of Fourth Embodiment.
Figure 26:
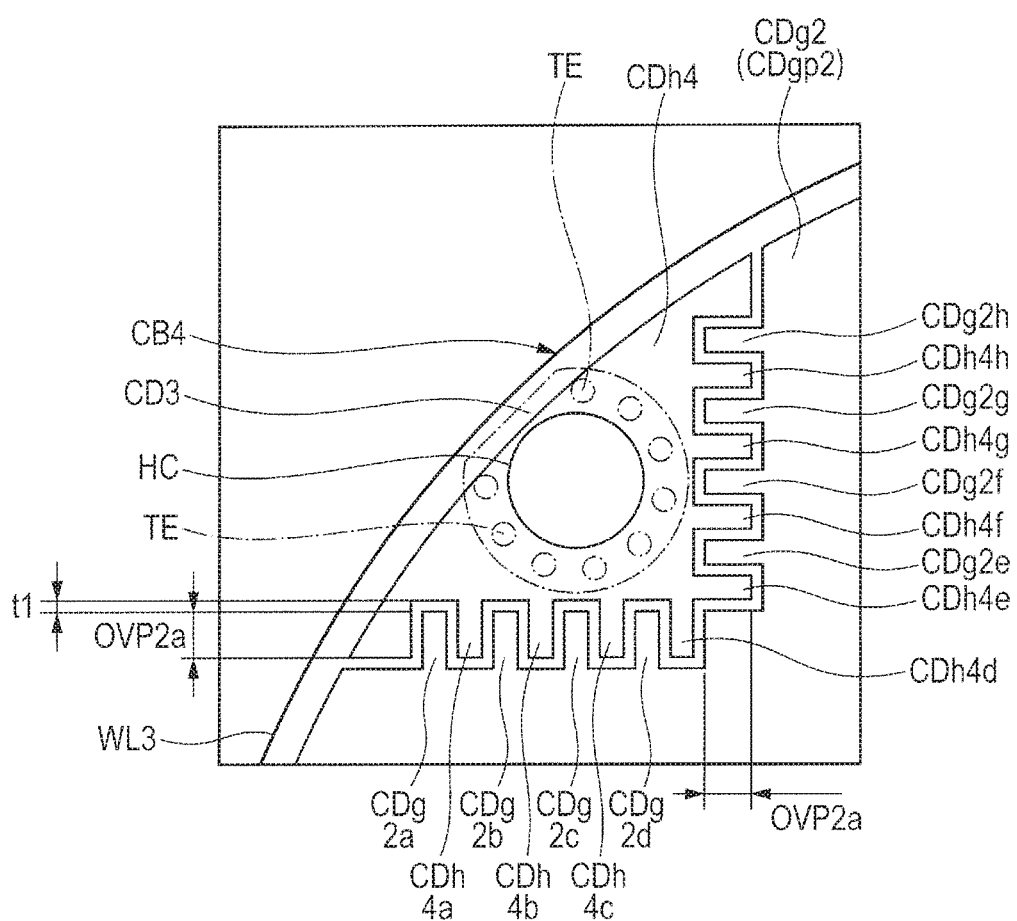
FIG. 26 is a partially enlarged plan view showing a structure of a third wiring layer of the wiring substrate of Fourth Embodiment.

Then, an electronic device of Fourth Embodiment will be described. FIG. 25 is a partially enlarged cross sectional view showing a fixed structure of a wiring substrate in the electronic device of Fourth Embodiment. FIG. 26 is a partially enlarged plan view showing a structure of a third wiring layer of the wiring substrate in the electronic device of Fourth Embodiment on an enlarged scale.

Although not shown, an electronic device ED4 of Fourth Embodiment has a wiring substrate CB4 in which electronic components are mounted at a wiring substrate (substrate). Other configurations than that of the wiring substrate CB3 are the same as those of the electronic device ED1 of First Embodiment. For this reason, the circuit configuration of the electronic device ED4 of Fourth Embodiment is the same as the circuit configuration of the electronic device ED1 of First Embodiment shown in FIG. 8. The difference between the wiring substrate CB4 of Fourth Embodiment and the wiring substrate CB1 of First Embodiment is in that at the wiring layer WL3, a ground pattern (conductor pattern or conductive film) CDg2 and a heat radiation pattern (conductor pattern or conductive film) CDh4 are formed, and in that the ground pattern CDg2 and the heat radiation pattern CDh4 overlap each other in the in-plane direction of the wiring substrate CB4. Below, the configuration of the wiring substrate CB4 of Fourth Embodiment will be described specifically.

As shown in FIG. 25, the ground pattern CDg2 is formed at the wiring layer WL3. Further, the heat radiation pattern CDh4 is formed at the wiring layer WL3. As shown in FIG. 25, in the present Fourth Embodiment, in the thickness direction of the wiring substrate CB4, the semiconductor device PKG1 and the ground pattern CDg2 overlap each other. Further, the ground pattern CDg2 and the heat radiation pattern CDh4 are formed at the same layer (the same wiring layer) at the wiring substrate CB4. In the in-plane direction of the wiring substrate CB4, the ground pattern CDg2 and the heat radiation pattern CDh4 overlap each other. Further, in the thickness direction of the wiring substrate CB4, the heat radiation pattern CDh4 and the projection BS formed at the main body part 1b overlap each other. Namely, the heat radiation pattern CDh4 overlaps the region where the back surface CBb of the wiring substrate CB4 and the housing HS are in contact with each other. Herein, the overlapping region of the ground pattern CDg2 and the heat radiation pattern CDh4 is expressed as an overlap part OVP2a; the overlapping region of the heat radiation pattern CDh4 and the projection BS, as an overlap part OVP2b; and the overlapping region of the heat radiation pattern CD4 and the projection BS, as an overlap part OVP2c. Incidentally, the ground pattern CDg2 and the heat radiation pattern CDh4 are not electrically coupled with each other.

Then, the wiring layer WL3 of the wiring substrate CB4 will be described in more details.

As shown in FIG. 26, at the wiring layer WL3 of the wiring substrate CB4, the heat radiation pattern CD3 is formed in a ring shape (in such a manner as to surround the through hole HC) along the outer circumference of the through hole HC. The heat radiation pattern CDh4 is formed in a quadrant shape in such a manner as to expand radially and outwardly from the outer circumference edge of the heat radiation pattern CD3. The heat radiation pattern CDh4 is integrally formed with the heat radiation pattern CD3. Namely, the heat radiation pattern CDh4 and the heat radiation pattern CD3 are electrically coupled with each other.

Then, from two radius parts of the heat radiation pattern CDh4, branched parts CDh4a, CDh4b, CDh4c, and CDh4d, and branched parts CDh4e, CDh4f, CDh4g, and CDh4h formed in a comb shape as a whole are formed in a projecting manner, respectively.

Further, at the wiring layer WL3 of the wiring substrate CB4, a ground pattern CDg2 is formed over the entire main surface of the wiring substrate CB4 except for the region where the heat radiation pattern CD3 is formed (although not shown, as with the ground pattern CDg1 of First Embodiment, except for the region where the through hole HC, the through electrode TE, the through electrodes 2i and 2j, the inputting coupling terminal NC, and the outputting coupling terminal OC are formed). Branched parts CDg2a, CDg2b, CDg2c, and CDg2d formed in a comb shape as a whole are formed in such a manner as to be alternate with the branched parts CDh4a, CDh4b, CDh4c, and CDh4d of the heat radiation pattern CDh4 at an interval t1 in a projecting manner from the side part of the ground pattern CDg2 facing to one radius part of the heat radiation pattern CDh4. Similarly, branched parts CDg2e, CDg2f, CDg2g, and CDg2h formed in a comb shape as a whole are formed in such a manner as to be alternate with the branched parts CDh4e, CDh4f, CDh4g, and CDh4h of the heat radiation pattern CDh4 at an interval t1 in a projecting manner from the side part of the ground pattern CDg2 facing to the other radius part of the heat radiation pattern CDh4.

Further, although not shown, the ground pattern CDg2 is formed of the power type ground pattern CDgp2 and the control type ground pattern. Furthermore, the heat radiation pattern CD3, the power type ground pattern CDgp2, and the control type ground pattern are not electrically coupled, respectively.

Herein, as described previously, for the wiring substrate CB4 of Fourth Embodiment, the overlapping region of the heat radiation pattern CDh4 and the ground pattern CDg2, namely, the overlap part OVP2a is the region where the branched parts CDh4a, CDh4b, and the like of the heat radiation pattern CDh4, and the branched parts CDg2a, CDg2b, and the like of the ground pattern CDg2 are alternately combined as shown in FIG. 26.

As shown in FIG. 25, for the electronic device ED4 of the present Fourth Embodiment, the heat generated from the semiconductor device PKG1 is transmitted via the insulation layer IL3 and the insulation layer IL2b to the ground pattern CDg2. Then, the heat transmitted to the ground pattern CDg2 diffuses into the ground pattern CDg2, and is transmitted to the heat radiation pattern CDh4 overlapping the ground pattern CDg2 in the in-plane direction of the wiring substrate CB4 via the insulation layer IL2b (overlap part OVP2a). Then, the heat transmitted to the heat radiation pattern CDh4 is mainly transmitted to the heat radiation pattern CD4 via the heat radiation pattern CD3 and the through electrode TE. The heat transmitted to the heat radiation pattern CD4 is transmitted to the projection BS of the main body part 1b overlapping the heat radiation pattern CD4 in the thickness direction of wiring substrate CB4 via the insulation layer IL3b (overlap part OVP2c). The heat transmitted to the projection BS of the main body part 1b diffuses to the entire housing HS including the main body part 1b. The heat radiation path described up to this point is indicated with arrows in FIG. 25.

Incidentally, it can also be considered that the heat transmitted to the heat radiation pattern CDh4 is transmitted to the projection BS of the main body part 1b overlapping the heat radiation pattern CDh4 in the thickness direction of the wiring substrate CB4 via the insulation layer IL2b and the insulation layer IL3b (overlap part OVP2b).

Further, as with First to Third Embodiments, for the electronic device ED4 of Fourth Embodiment, other electronic components including the semiconductor devices PKG2 and PKG3, and the coil L also overlap the ground pattern CDg2 in the thickness direction of the wiring substrate CB4 (plan view). For this reason, the heat generated from the semiconductor devices PKG2 and PKG3, the coil L, and the like also diffuses via the ground pattern CDg2, the heat radiation pattern CDh4, the heat radiation pattern CD4, and the projection BS to the entire housing HS.

From the description up to this point, for the electronic device ED4 of Fourth Embodiment, as shown in FIGS. 25 and 26, the heat radiation pattern CDh4 is formed at the wiring layer WL3 including the ground pattern CDg2 formed thereat. For this reason, at the wiring layer WL4, only the heat radiation pattern CD4 is formed around the through hole HC of the circumferential part of the wiring substrate CB4. Therefore, as compared with the electronic device ED1 of First Embodiment to the electronic device ED3 of Third Embodiment in each of which the heat radiation pattern CDh1 is formed at the wiring layer WL4, for the electronic device ED4 of Fourth Embodiment, the wiring region for elements such as the semiconductor device PKG1 can be sufficiently ensured without reducing the wiring region for elements such as the semiconductor device PKG1 at the wiring layer WL4. For this reason, it is possible to enhance the mounting efficiency of the semiconductor devices, and other electronic components without increasing the size of the wiring substrate CB4.

Further, in Fourth Embodiment, the heat radiation pattern CDh4 and the ground pattern CDg2 are not electrically coupled with each other. For this reason, as with First Embodiment described previously, even in the case where the inner circumferential surface of the through hole HC is cut by the screw BT, thereby to expose the heat radiation pattern CDh4 when the wiring substrate CB4 is fixed to the projection BS, it is possible to prevent the malfunction of the control type circuit resulting from the propagation of an external noise from the housing HS via the heat radiation pattern CDh4 to the ground pattern CDg2.

In Fourth Embodiment, the interval t1 between the heat radiation pattern CDh4 and the ground pattern CDg2 is preferably smaller from the viewpoint of the heat radiation efficiency. On the other hand, from the viewpoint of avoiding the electric contact between the heat radiation pattern CDh4 and the ground pattern CDg2, the interval t1 between the heat radiation pattern CDh4 and the ground pattern CDg2 is preferably not set too small. From the description up to this point, the interval t1 between the heat radiation pattern CDh4 and the ground pattern CDg2 is preferably 0.1 mm or more and 0.8 mm or less.

However, for the electronic device ED4 of Fourth Embodiment, the heat radiation pattern CDh4 and the ground pattern CDg2 are formed at the same wiring layer WL3. For this reason, it is not possible to set a large area of the overlap part OVP2a of the heat radiation pattern CDh4 and the ground pattern CDg2.

On the other hand, each heat radiation pattern CDh1 of First Embodiment and Third Embodiment, and the heat radiation pattern CDh2 of Second Embodiment are formed at the wiring layer WL4. For this reason, it is possible to set a large area of the overlap part OVP1a with the ground pattern CDg1 formed at a separate wiring layer WL3. As described in the section of Experimental results, when the area of the overlap part OVP1a of the heat radiation pattern CDh1 or the heat radiation pattern CDh2 and the ground pattern CDg1 is larger, the heat transmitted from the semiconductor device PKG1 to the ground pattern CDg1 is transmitted to the heat radiation pattern CDh1 or the heat radiation pattern CDh2 with more efficiency. For this reason, in First Embodiment to Third Embodiment, the thermal conductivity efficiency can be enhanced than in Fourth Embodiment.

From the description up to this point, when an importance is placed on the wiring efficiency, the configuration of the electronic device ED4 of Fourth Embodiment is preferably adopted. On the other hand, when an importance is placed on the heat radiation efficiency, as described previously, the electronic device ED1 of First Embodiment to the electronic device ED3 of Third Embodiment are preferably adopted.

Incidentally, a description has been given by taking as an example the case where at the wiring substrate CB4 of the present Fourth Embodiment, the branched parts CDh4a, CDh4b, and the like formed in a comb shape as a whole from the heat radiation pattern CDh4, and the branched parts CDg2a, CDg2b, and the like formed in a comb shape as a whole from the ground pattern CDg2 are formed. However, the present invention is not limited thereto. It is essential only that at the wiring substrate CB4 of Fourth Embodiment, the heat radiation pattern CDh4 and the ground pattern CDg2 overlap each other in the in-plane direction of the wiring substrate CB4.

Further, a description has been given by taking as an example the case where at the wiring substrate CB4 of the present Fourth Embodiment, the heat radiation patterns CD1, CD2, CD3, and CD4 and the through electrode TE are formed. However, the present invention is not limited thereto. For example, the heat radiation patterns CD1, CD2, CD3, and CD4 and the through electrode TE can be omitted, if not required in manufacturing. However, as described previously, when the heat radiation patterns CD1, CD2, CD3, and CD4, and the through electrode TE are formed at the wiring substrate CB4, a heat radiation path formed of the heat radiation pattern CD1, and the like is formed. For this reason, the formation of the heat radiation pattern CD1, and the like at the wiring substrate CB4 can enhance the heat radiation efficiency as compared with the case where the heat radiation pattern CD1, and the like are not formed.

Particularly, when the heat radiation patterns CD3 and CD4 and the through electrode TE are formed at the wiring substrate CB4 of Fourth Embodiment, as described previously, a heat is transmitted from the heat radiation pattern CDh4 and the heat radiation pattern CD3 through the through electrode TE to the heat radiation pattern CD4, and a heat radiation path is formed through which the heat is released from the heat radiation pattern CD4 via the insulation film IL3b to the projection BS. On the other hand when the heat radiation patterns CD3 and CD4 and the through electrode TE are not present, a heat radiation path is formed through which the heat is released from the heat radiation pattern CDh4 via the insulation film IL2b and the insulation film IL3b to the projection BS. For this reason, the heat radiation patterns CD3 and CD4 and the through electrode TE enable heat radiation from the heat radiation pattern CDh4 close to the projection BS to the projection BS not via the insulation film IL2b from the heat radiation pattern CDh4. For this reason, from the viewpoint of enhancing the heat radiation efficiency, at least the heat radiation patterns CD3 and CD4 and the through electrode TE are preferably formed.

Up to this point, the present invention completed by the present inventors has been described specifically by way of embodiments. However, It is naturally understood that the present invention is not limited by the embodiments, and may be variously changed within the scope not departing from the gist thereof.

What is claimed is:

1. An electronic device, comprising: a wiring substrate having a first main surface, a second main surface opposite to the first main surface, and a plurality of wiring layers arranged between the first main surface and the second main surface; one or more components including a first semiconductor device, mounted over the wiring substrate; and a housing made of a metal for supporting the wiring substrate, wherein the first semiconductor device has a switching power transistor, wherein the housing is in contact with the second main surface of the wiring substrate, wherein a first conductor pattern is formed at a first wiring layer of the wiring layers, wherein a second conductor pattern is formed at a second wiring layer of the wiring layers, wherein the first conductor pattern is a ground pattern for supplying a ground potential or a power supply pattern for supplying a power supply potential, and overlaps the first semiconductor device in the thickness direction of the wiring substrate, wherein the second conductor pattern is not electrically coupled with any of the one or more components, and is also not electrically coupled with the first conductor pattern, wherein the second conductor pattern overlaps the first conductor pattern in the thickness direction of the wiring substrate, and wherein the second conductor pattern overlaps a region where the housing and the wiring substrate are in contact with each other in the thickness direction of the wiring substrate.

2. The electronic device according to claim 1, wherein the first semiconductor device is mounted over the second main surface of the wiring substrate.

3. The electronic device according to claim 2, wherein the second wiring layer is the wiring layer closest to the second main surface of the wiring layers.

4. The electronic device according to claim 1, wherein the first wiring layer and the second wiring layer are the adjacent wiring layers of the wiring layers.

5. The electronic device according to claim 1, wherein the first conductor pattern is the ground pattern.

6. The electronic device according to claim 1, wherein a motor is incorporated in the housing, and wherein an output from the first semiconductor device is supplied to the motor for driving the motor.

7. The electronic device according to claim 1, wherein the wiring substrate is fixed to the housing by a bonding member made of a metal, wherein the bonding member is arranged in a first through hole penetrating through the first main surface and the second main surface at the circumferential part of the wiring substrate, and wherein the second conductor pattern is formed at the periphery of the first through hole, and overlaps the housing at the periphery of the first through hole.

8. The electronic device according to claim 7, wherein at the wiring layers, a third conductor pattern including a plurality of conductor patterns overlapping each other in the thickness direction of the wiring substrate is formed at the periphery of the first through hole, and overlaps the housing at the periphery of the first through hole.

9. The electronic device according to claim 8, wherein the wiring substrate has: a second through hole penetrating from a surface including the uppermost wiring layer of the wiring layers formed thereover toward a surface including the lowermost wiring layer formed thereover, and a through electrode formed in the inside of the second through hole, and wherein the second through hole is arranged at the periphery of the first through hole.

10. The electronic device according to claim 9, wherein the through electrode electrically couples the conductor patterns forming the third conductor pattern, and wherein the second conductor pattern is electrically coupled with the third conductor pattern.

11. The electronic device according to claim 7, wherein the second conductor pattern extends along the outer circumference of the wiring substrate.

12. The electronic device according to claim 11, wherein a plurality of the first through holes are provided, and wherein the second conductor pattern overlaps the housing at the periphery of the first through holes.

13. The electronic device according to claim 1, wherein the second conductor pattern is electrically coupled with the housing.

14. An electronic device, comprising: a wiring substrate having a first main surface, a second main surface opposite to the first main surface, and a plurality of wiring layers arranged between the first main surface and the second main surface; one or more components including a first semiconductor device, mounted over the wiring substrate; and a housing made of a metal for supporting the wiring substrate, wherein the first semiconductor device has a switching power transistor, wherein the housing is in contact with the second main surface of the wiring substrate, wherein a first conductor pattern and a second conductor pattern are formed at a first wiring layer of the wiring layers, wherein the first conductor pattern is a ground pattern for supplying a ground potential or a power supply pattern for supplying a power supply potential, and overlaps the first semiconductor device in the thickness direction of the wiring substrate, wherein the second conductor pattern is not electrically coupled with any of the one or more components, and is also not electrically coupled with the first conductor pattern, wherein the second conductor pattern overlaps the first conductor pattern in the in-plane direction of the wiring substrate, and wherein the second conductor pattern overlaps a region where the housing and the wiring substrate are in contact with each other in the thickness direction of the wiring substrate.

15. The electronic device according to claim 14,
wherein the wiring substrate is fixed to the housing by a bonding member made of a metal,
wherein the bonding member is arranged in a first through hole penetrating from the first main surface toward the second main surface at the circumferential part of the wiring substrate, and
wherein the second conductor pattern is formed at the periphery of the first through hole, and overlaps the housing at the periphery of the first through hole.

16. The electronic device according to claim 15,
wherein at the wiring layers, a third conductor pattern including a plurality of conductor patterns overlapping each other in the thickness direction of the wiring substrate is formed at the periphery of the first through hole, and overlaps the housing at the periphery of the first through hole.

17. The electronic device according to claim 16,
wherein the wiring substrate has:
a second through hole penetrating from a surface including the uppermost wiring layer of the wiring layers formed thereover toward a surface including the lowermost wiring layer formed thereover, and a through electrode formed in the inside of the second through hole, and
wherein the second through hole is arranged at the periphery of the first through hole.

18. The electronic device according to claim 17,
wherein the through electrode electrically couples the conductor patterns forming the third conductor pattern, and
wherein the second conductor pattern is electrically coupled with the third conductor pattern.

* * * * *